United States Patent
Giorgi et al.

(10) Patent No.: US 10,707,804 B2
(45) Date of Patent: Jul. 7, 2020

(54) SMART SHINGLES

(71) Applicants: Michael E. Giorgi, Hudson, OH (US); Patrick M. Mause, Streetsboro, OH (US); Steven Rosen, Hunting Valley, OH (US)

(72) Inventors: Michael E. Giorgi, Hudson, OH (US); Patrick M. Mause, Streetsboro, OH (US); Steven Rosen, Hunting Valley, OH (US)

(73) Assignee: Resilience Magnum IP, LLC, Cleveland, OH (US)

(*) Notice: Subject to any disclaimer, the term of this patent is extended or adjusted under 35 U.S.C. 154(b) by 29 days.

(21) Appl. No.: 16/206,320

(22) Filed: Nov. 30, 2018

(65) Prior Publication Data
US 2019/0165718 A1   May 30, 2019

Related U.S. Application Data

(60) Provisional application No. 62/592,722, filed on Nov. 30, 2017.

(51) Int. Cl.
*H02S 20/25* (2014.01)
*H02S 50/10* (2014.01)
(Continued)

(52) U.S. Cl.
CPC .............. *H02S 20/25* (2014.12); *E04D 1/12* (2013.01); *E04D 1/30* (2013.01); *F24S 20/69* (2018.05); *G05B 19/048* (2013.01); *H01L 35/30* (2013.01); *H02S 40/32* (2014.12); *H02S 40/38* (2014.12); *H02S 50/00* (2013.01); *H02S 50/10* (2014.12); *E04D 2001/308* (2013.01)

(58) Field of Classification Search
CPC .......... H02S 20/25; H02S 40/32; H02S 40/38; H02S 50/10; H02S 50/00; F24S 20/69; E04D 1/12; E04D 1/30; E04D 2001/308; G05B 19/048; H01L 35/30
See application file for complete search history.

(56) References Cited

U.S. PATENT DOCUMENTS

2017/0346295 A1* 11/2017 Yoscovich ............... H02S 40/34

* cited by examiner

*Primary Examiner* — Robert L Deberadinis
(74) *Attorney, Agent, or Firm* — Amin, Turocy & Watson, LLP

(57) ABSTRACT

At least one shingle is integrated with logic circuitry and various other components which enable high-level functionality and automated system diagnostics. Each shingle can automatically determine its absolute position on a rooftop and/or its position relative to other shingles in the smart shingle system. Each shingle can also detect various changes in its own power generation, efficiency, and/or operating conditions, as well as those of neighboring shingles. Each shingle can then leverage this information to conduct system diagnostics and possibly to generate and/or execute recommended solutions. In another embodiment, each shingle can be coupled to a centralized controller which can perform the same automapping and diagnostic functions. The controller can also monitor the power usage of the building to help optimize the power generation of the smart shingle system. In some embodiments, the smart shingle system can be outfitted with heating components and/or actuators to help automate the process of keeping the smart shingles clear of debris.

20 Claims, 27 Drawing Sheets

(51) Int. Cl.
*H02S 40/38* (2014.01)
*E04D 1/30* (2006.01)
*G05B 19/048* (2006.01)
*F24S 20/69* (2018.01)
*H02S 40/32* (2014.01)
*E04D 1/12* (2006.01)
*H02S 50/00* (2014.01)
*H01L 35/30* (2006.01)

SMART SHINGLES

CROSS-REFERENCE TO RELATED APPLICATIONS

This application claims priority to U.S. Provisional Patent Application Ser. No. 62/592,722 filed on Nov. 30, 2017, entitled "SMART SHINGLES." The entirety of the aforementioned application is incorporated by reference herein.

TECHNICAL FIELD

This disclosure relates generally to the field of building-integrated photovoltaics. More particularly, this disclosure pertains to systems and methods concerning photovoltaic shingles with integrated logic circuitry and sensors which enable the automation of solar power system diagnostics and other tasks.

BACKGROUND

As evidence of mankind's deleterious impact on the environment has continued to mount, research and development concerning renewable energy technology has increased commensurately. Building-integrated photovoltaics (BIPV) represents one such field of technology. BIPV involves integrating solar panels into buildings while the buildings are under construction or renovation, wherein the solar panels replace traditional building components (i.e. roofs, walls, façades, skylights, etc.), rather than retroactively installing solar panels onto buildings after construction/renovation and in addition to traditional building components. By installing the solar panels during the initial construction or subsequent renovation and by using the solar panels in place of some traditional building components, labor and material costs are saved.

One area of BIPV that has recently attracted market attention is solar shingles, such as those produced by Tesla™. Solar shingles function as both solar panels (i.e. they convert sunlight into electricity) and traditional roofing shingles (i.e. they help to protect the building from inclement weather and serve to enhance its aesthetic appeal). Because conventional, rooftop solar panels are visually distinguishable from normal shingles, many consider them to be aesthetically unappealing. Solar shingles, in contrast, look and function like normal shingles, and so they integrate seamlessly into rooftops.

Despite the incredible technological advancement which solar shingles represent, they are not perfect. Current solar shingle systems require manual inspection and offer users no reliable way of conducting system diagnostics. For example, when a conventional solar shingle is damaged or obstructed, the power generation of the entire solar shingle system decreases. However, assuming that the user monitors the system diligently enough to notice the diminished power output, he/she does not know which shingles are affected. Moreover, the user does not know whether the affected shingles (whichever ones they may be) are actually damaged or are merely obstructed (i.e. by debris, leaves, shadows, bird droppings, etc.) or whether the sun had simply shone less during the previous monitoring period. Furthermore, even if the user correctly guesses that the affected shingles are damaged, he/she does not know which component of each affected shingle is to blame.

Additionally, current solar shingle systems require manual maintenance. In other words, the user (or the user's agent) must physically interact with the rooftop in order to clear any debris, leaves, or other obstruction that prevents the solar shingles from gathering as much sunlight as they otherwise would. Although the quick removal of leaves, a tree branch, or bird droppings is not necessarily overly burdensome to the user, the removal of snow and/or ice build-up in the winter can be time-consuming and dangerous.

Lastly, current solar shingles do not leverage the wealth of readily-available information that pertains to a building's power usage and generation. For example, conventional solar shingle systems do not dynamically take into consideration the real-time power usage of the building, the time of day, the season, any local weather forecasts, local electricity prices, etc. Making use of this information can help to optimize the power generation of the solar shingle system.

The subject claimed invention helps to address these short-comings of conventional solar shingles.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular implementations of the specification, or any scope of the claims. Its purpose is to present some concepts of the specification in a simplified form as a prelude to the more detailed description that is presented in this disclosure.

Systems and methods disclosed herein relate to smart shingles (i.e. photovoltaic shingles with integrated logic circuitry that enables the automation of solar power system diagnostics and other tasks). At least one shingle of a building is integrated with a solar collector, which converts solar energy to electricity. The solar collector, which is comprised of any suitable photovoltaic material, is optionally coupled to an inverter, located outside or inside the shingle. The inverter receives direct current (DC) electricity from the solar collector and converts it to alternating current (AC) electricity to be fed into the electrical grid of the building or to be used directly by any appliances of the building. As one having ordinary skill in the art will appreciate, no inverter is required if AC electricity is not needed for the application in question.

In one embodiment, the at least one shingle is coupled to a battery, located outside or inside the shingle. In such a case, the DC electricity produced by the solar collector can be used to charge the battery, which then helps to power the electronic components of the shingle, which are discussed below.

The at least one shingle is further integrated with an electronic processor, a computer-readable memory, and a location component. The location component determines the location of the shingle relative to other smart shingles (i.e. shingles integrated with solar collectors and logic circuitry) and stores that information as the shingle address. Alternatively, the location component can simply be given a shingle address to store, obviating the need to determine the shingle address.

The at least one shingle is coupled to a controller. The controller, which also comprises an electronic processor and a computer-readable memory, can leverage the shingle address of each smart shingle coupled to it in order to automatically map (i.e. automap) the locations of the smart shingles relative to each other. In this way, the controller can determine which smart shingles are neighbors. Such information can help in performing system maintenance and diagnostics.

In one embodiment, the at least one shingle can further be coupled to a converter, located outside or inside the shingle. In such a case, the converter converts AC electricity from the electrical grid of the building into DC electricity. This DC electricity can then be used to power the electronic components of the smart shingle. In another embodiment, the converter can feed DC electricity to a shingle's battery, so as to charge the battery.

In one embodiment, the at least one shingle can be integrated with a thermo-electric component (i.e. a heat exchanger). The thermo-electric component can convert heat from the sun as well as latent heat from the building into DC electricity, which is then fed to an inverter (if present) and/or a battery (if present). In this way, the energy output of the at least one shingle is increased.

In various other embodiments, the at least one shingle is integrated with at least one sensor so as to sense changes in the shingle's power generation, efficiency, and/or operating conditions. For example, a shingle may be outfitted with: a power sensor (i.e. to determine the electric power produced by the shingle); an efficiency sensor (i.e. to determine how well or poorly the shingle is producing electricity); a temperature sensor (i.e. to determine the ambient temperature as well as the temperature within the building); a pressure sensor (i.e. to determine when something is physically contacting the shingle); a light sensor (i.e. to determine whether the sunlight is wholly or partially blocked by some obstruction); a moisture sensor (i.e. to determine whether moisture is present within the electronic compartments of the shingle itself, thereby indicating insufficient waterproofing); a corrosion and/or continuity sensor (i.e. to determine whether the electric connections coupling the shingle and its electronic components to the controller and the electrical grid are damaged); and/or a maintenance component (i.e. to track the maintenance and repair record of the shingle). All of this information can be leveraged by the controller to conduct system diagnostics.

In one embodiment, the controller further comprises a notification component, which notifies the user of the data detected by the sensors (if any).

In another embodiment, the controller (or the shingle itself) can be outfitted with an artificial intelligence component that can leverage the automap information and the diagnostic information determined by the sensors (if any) in order to diagnose the problems and recommend solutions to be taken by the user. For example, if one shingle senses reduced power output while all its neighboring shingles do not, the artificial intelligence component can determine that it is more likely than not that that particular shingle is damaged. However, if the affected shingle's pressure sensor and light sensor are both activated, the artificial intelligence component can determine that it is more likely than not that that particular shingle is being obstructed by debris and can then notify the user that said debris should be cleared.

In other embodiments, the at least one shingle can be outfitted with a heating component so as to easily clear away snow and/or ice build-up, one or more actuating components so as to help clear other movable debris as well as to adjust the angle of incidence between the shingle and the sunlight, and even light-emitting diodes (LEDs) so as to enable optical signals and indicators to be shown on the shingle.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, implementations, and advantages of the present invention will be apparent upon consideration of the following detailed description, taken in conjunction with the accompanying drawings, in which like reference characters refer to like parts throughout, and in which.

DETAILED DESCRIPTION

Figure 1:
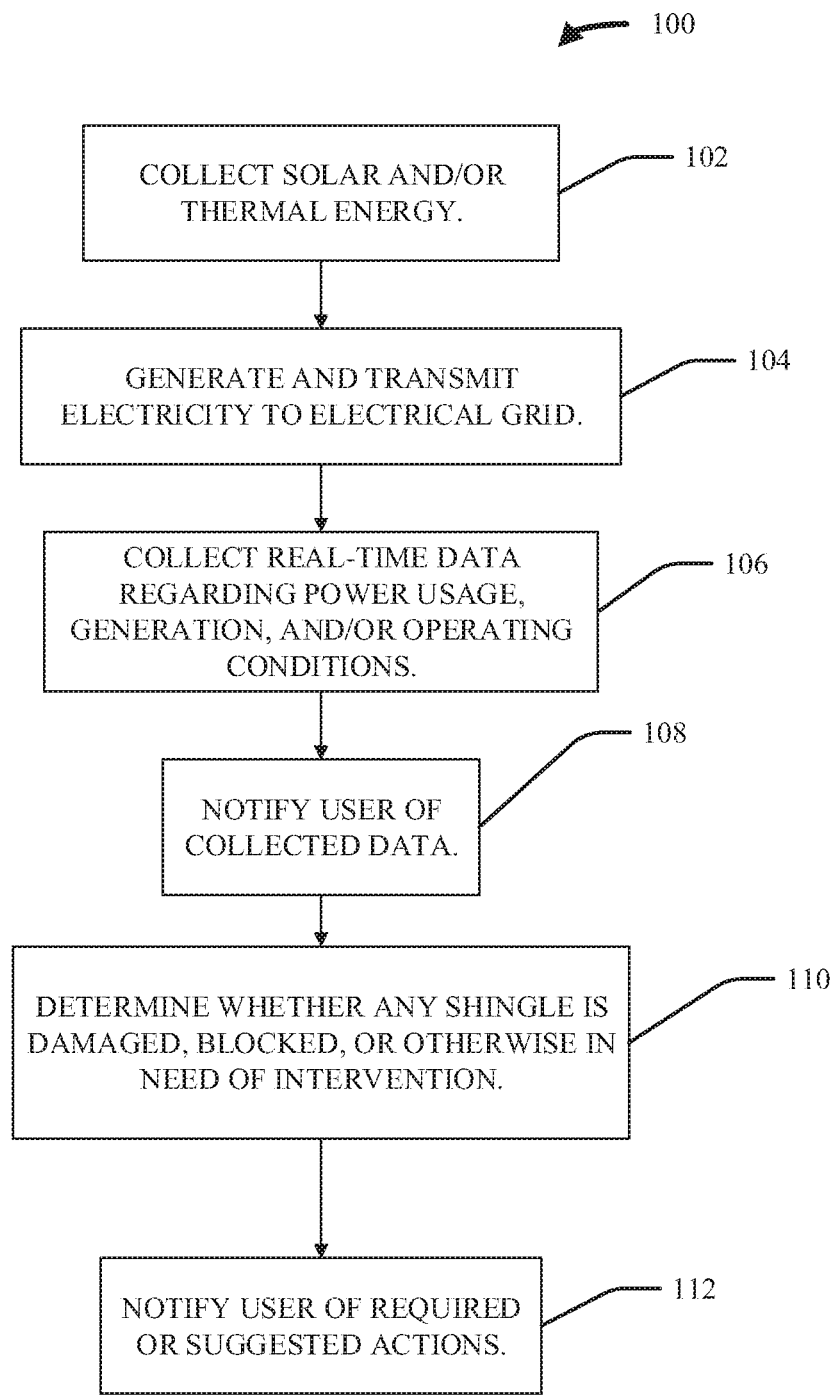
FIG. 1 illustrates an example methodology concerning automated solar system diagnostics in accordance with various aspects disclosed herein.

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing this disclosure.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (i.e. screwed or bolted) or removably affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (i.e. data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic (that is, the computation of a probability distribution over states of interest based on a consideration of data and events). Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; i.e. the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; i.e. a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

Now, systems and methods disclosed herein relate to smart shingles (i.e. photovoltaic shingles with integrated logic circuitry, which are capable of performing automated system diagnostics and certain other tasks). To provide a thorough understanding of the subject claimed invention, attention is invited to the appended figures.

FIG. 1 illustrates an example methodology 100 concerning automated system diagnostics of a building's smart shingle system in accordance with various aspects disclosed herein. Method 100 demonstrates the high-level operation and functionality of the subject claimed invention. At 102, the smart shingle system collects solar and/or thermal energy. At 104, the smart shingle system converts the collected energy into electricity which is then transmitted to the electrical grid of the building. This is accomplished through the use of solar panels (i.e. through the photoelectric effect) and/or heat exchangers (i.e. through the thermo-electric effect) that are integrated into the smart shingles. Alternatively, or possibly concurrently, some or all of the generated electricity can be channeled directly to appliances, machines, computers, electronics, and/or any other device or application that requires electrical power.

At 106, the smart shingle system collects real-time data regarding the power usage of the building, the power generation of the smart shingle system, and/or the various operating conditions of the smart shingle system. In some embodiments, the smart shingle system can detect the location of each smart shingle, the amount of electric power being produced by each smart shingle, the efficiency of each smart shingle, the temperature of each smart shingle as well as the temperature of the ambient air and the temperature of the highest-level in the building, the pressure applied to the surface of each smart shingle, the light incident on the surface of each smart shingle, the moisture level within the electronic compartments of each smart shingle, and/or the efficacy of the electric connections within each smart shingle and the smart shingle system as a whole. Various other sensors may be integrated into the smart shingle system in accordance with this disclosure and the spirit of the subject claimed invention.

At 108, the smart shingle system may notify the user of the data that was collected at 106. This may be accomplished by any means suitable for notification of one or more users. For example, the smart shingle system may notify by means of a visual message and/or alert composed of text and/or numbers that is received and displayed on a laptop computer, a desktop computer, a mobile device, dedicated hardware built directly into the smart shingle system, any other device capable of displaying such visual messages/alerts, and/or any combination thereof. In another embodiment, the smart shingle system may notify by means of an audible message and/or alert that is received and/or played by a laptop computer, a desktop computer, a mobile device, dedicated hardware built directly into the smart shingle system, any other device capable of playing such audible messages/alerts, and/or any combination thereof. In still another embodiment, the smart shingle system may notify by means of vibratory messages and/or alerts, in much the same way that mobile devices vibrate when they receive text messages or emails. Moreover, the level of detail conveyed in the notification is immaterial. For example, the subject claimed invention equally encompasses a notification which conveys the exact numeric values recorded by a smart shingle's sensors as well as a notification which indicates merely that the sensors have been activated.

In one embodiment, the smart shingle system, at 110, uses the data collected at 106 to determine whether any smart shingle is damaged, obstructed, or otherwise in need of intervention (i.e. cleaning, repair, maintenance, etc.). In another embodiment, an artificial intelligence component can be integrated into the smart shingle system so as to apply inferential logic and/or pattern recognition in order to conduct system diagnostics (i.e. analyze the collected data and infer likely problems concerning the smart shingle system and/or their corresponding solutions). For example, if a smart shingle system senses a single shingle that produces less power than all its neighboring shingles, the artificial intelligence component may infer that the affected shingle is somehow damaged and/or obstructed. If the shingle's moisture sensor indicated that water had leaked into the electronics compartments or if the shingle's corrosion/continuity sensor indicated that the shingle's electrical connections are suboptimal, the artificial intelligence component may infer that the shingle is defective. However, if the light sensor is activated (i.e. indicating that the shingle is not collecting as much light as it otherwise could be) while neither the moisture sensor nor the corrosion/continuity sensor is activated, the artificial intelligence component may infer that the shingle is obstructed rather than damaged. Depending on information gathered from various other sensors, the artificial intelligence component may determine recommended actions to be taken by the user in order to solve the problem.

Finally, at 112, the smart shingle system notifies the user by any appropriate means, as explained above in connection with step 106, of the diagnosed problems and recommended solutions.

As shown by method 100, the automation of solar power system diagnostics enables the subject claimed invention to quickly, accurately, and reliably identify problems related to solar shingle systems as opposed to forcing the user to constantly, manually monitor said systems. As mentioned in the Background section above, current solar shingle systems require manual inspection and offer users no reliable way of conducting system diagnostics. For example, if a conventional solar shingle were damaged or obstructed, the power generation of the entire solar shingle system would decrease. However, it is not guaranteed that the user would monitor the solar power generation enough to notice the diminished power output. Even if the user did, he/she would not know which shingles were defective and/or obstructed. Moreover, the user would not know whether the affected shingles were actually damaged or were merely obstructed (i.e. by debris, leaves, shadows, bird droppings, etc.) or whether the sun had simply shone less during the previous monitoring period. Furthermore, even if the user correctly guessed that the affected shingles were damaged, he/she would not know which subcomponent of each affected shingle was to blame. All this doubt ultimately forces conventional solar power system diagnostics to be a guessing game. The subject claimed invention, however, solves this problem by integrating each solar shingle with logic circuitry and/or a set of sensors to quickly and accurately pinpoint and solve (to the extent possible) performance anomalies.

Figure 2:
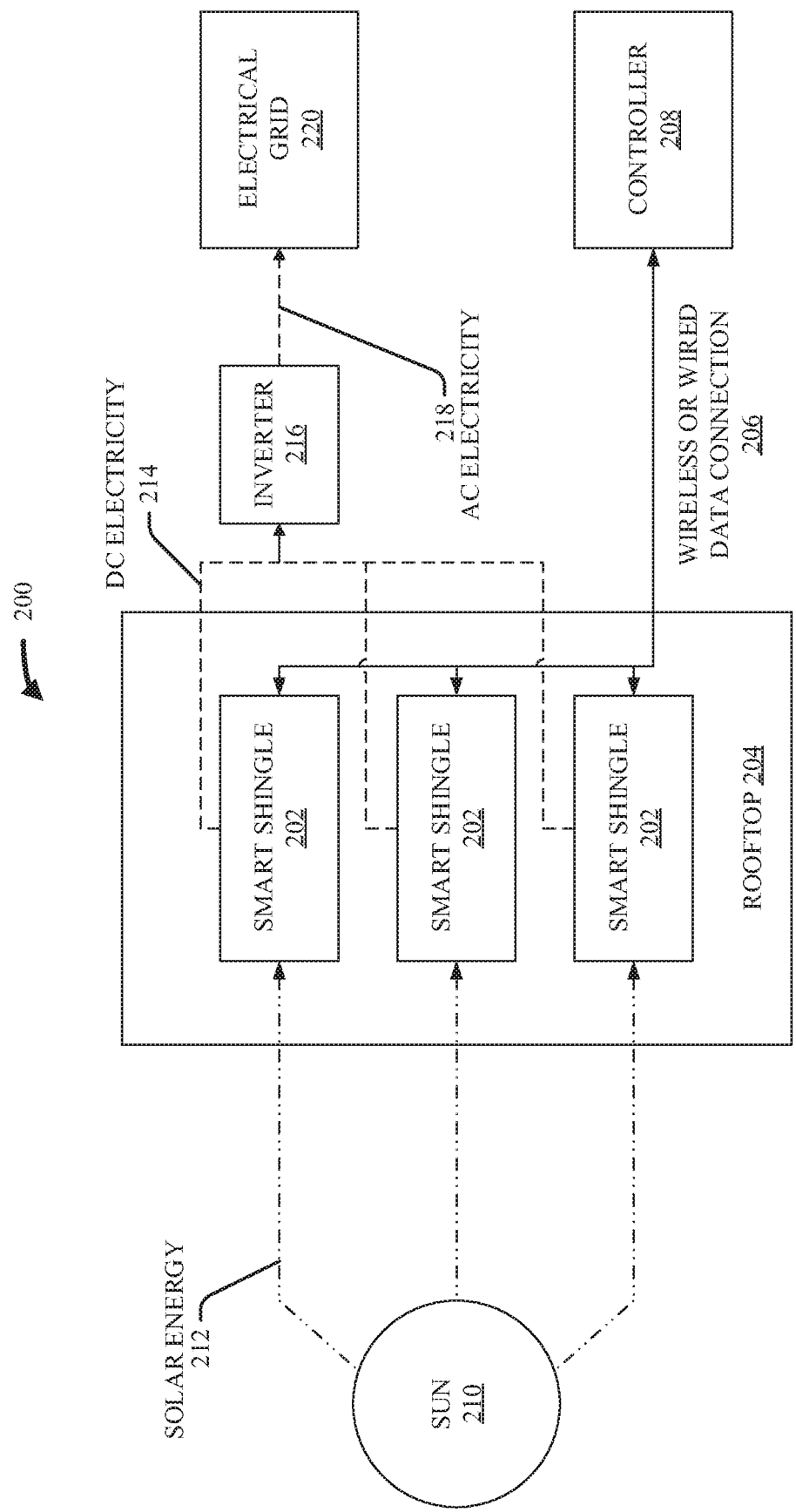
FIG. 2 illustrates a high-level functional block diagram of an example system comprising at least one smart shingle coupled to a controller, an electrical grid, and an inverter in accordance with various aspects disclosed herein.

Now, FIG. 2 depicts an exemplary system 200 comprising at least one smart shingle coupled to a controller, an electrical grid, and an inverter in accordance with various aspects disclosed herein. In other words, FIG. 2 simply shows the high-level interconnection of some primary components of one embodiment of the subject claimed invention. As shown, a set of smart shingles 202 is located on rooftop 204. Each smart shingle 202 is designed to function as both a solar collector (i.e. solar panel, module, cell, and/or array) and a conventional roofing shingle (i.e. to protect the building from inclement weather and to augment the aesthetic appeal of the building). Thus, each smart shingle 202 is approximately the same size and shape as conventional roofing shingles but is integrated with solar panels and additional logic circuitry so as to enable the higher functionality which constitutes the subject claimed invention. Furthermore, each smart shingle 202 is designed to be weather and water resistant, according to weatherproofing and waterproofing methods known in the art, so as to protect the building as well as the electronic components within each shingle.

Smart shingles 202 are communicatively connected to controller 208 via wireless or wired data connection 206. Wireless or wired data connection 206 can comprise any suitable means of electronic communication which would enable controller 208 to collect data from and/or otherwise interact with smart shingles 202, including but not limited to Ethernet, USB, Micro USB, Mini USB, Lightning™ port, wireless bus, Bluetooth™, etc. Controller 208 is simply one or more computerized devices which can collect data from, and, in some instances, send instructions to, smart shingles 202. As will be explained in more detail below, controller 208 continuously (or less frequently, in an embodiment) monitors smart shingles 202 and, in some embodiments, uses that monitored information to perform system diagnostics and recommend appropriate courses of action.

As shown, smart shingles 202 collect solar energy 212 from sun 210 by absorbing sunlight. Smart shingles 202 then convert solar energy 212 into DC electricity 214. This occurs via a set of solar collectors (i.e. any photovoltaic cell, module, panel, and/or array) that is integrated into smart shingles 202.

Because most commercial and industrial appliances and devices require AC electricity, DC electricity 214 is channeled to inverter 216, which converts DC electricity 214 to AC electricity 218. Finally, AC electricity 218 is channeled to electrical grid 220 of the building. Alternatively, AC electricity 218 may be channeled to any device, appliance, and/or application in need of AC electricity. For example, the AC electricity ultimately produced by the smart shingle system may be wholly channeled to the building's power grid. However, it may also be wholly or partially channeled to other power grids and/or even to individual devices or groups of devices that require AC electric power. Furthermore, in one embodiment, smart shingle system 200 is used to power machines, computers, appliances, and/or devices which may be powered directly by DC electricity. In such case, inverter 216 may be omitted from smart shingle system 200 altogether.

Although FIG. 2 depicts smart shingle system 200 as comprising a single inverter 216, one having ordinary skill in the art can appreciate that multiple inverters can be used, for example if different voltages or frequencies of AC electricity are simultaneously required, or for other reasons. Moreover, although FIG. 2 shows inverter 216 as external to smart shingles 202, one of ordinary skill in the art can appreciate that each smart shingle 202 can comprise its own inverter located internally (or located externally but close to each smart shingle 202) so as to reduce transmission losses. This is illustrated by FIG. 3.

Figure 3:
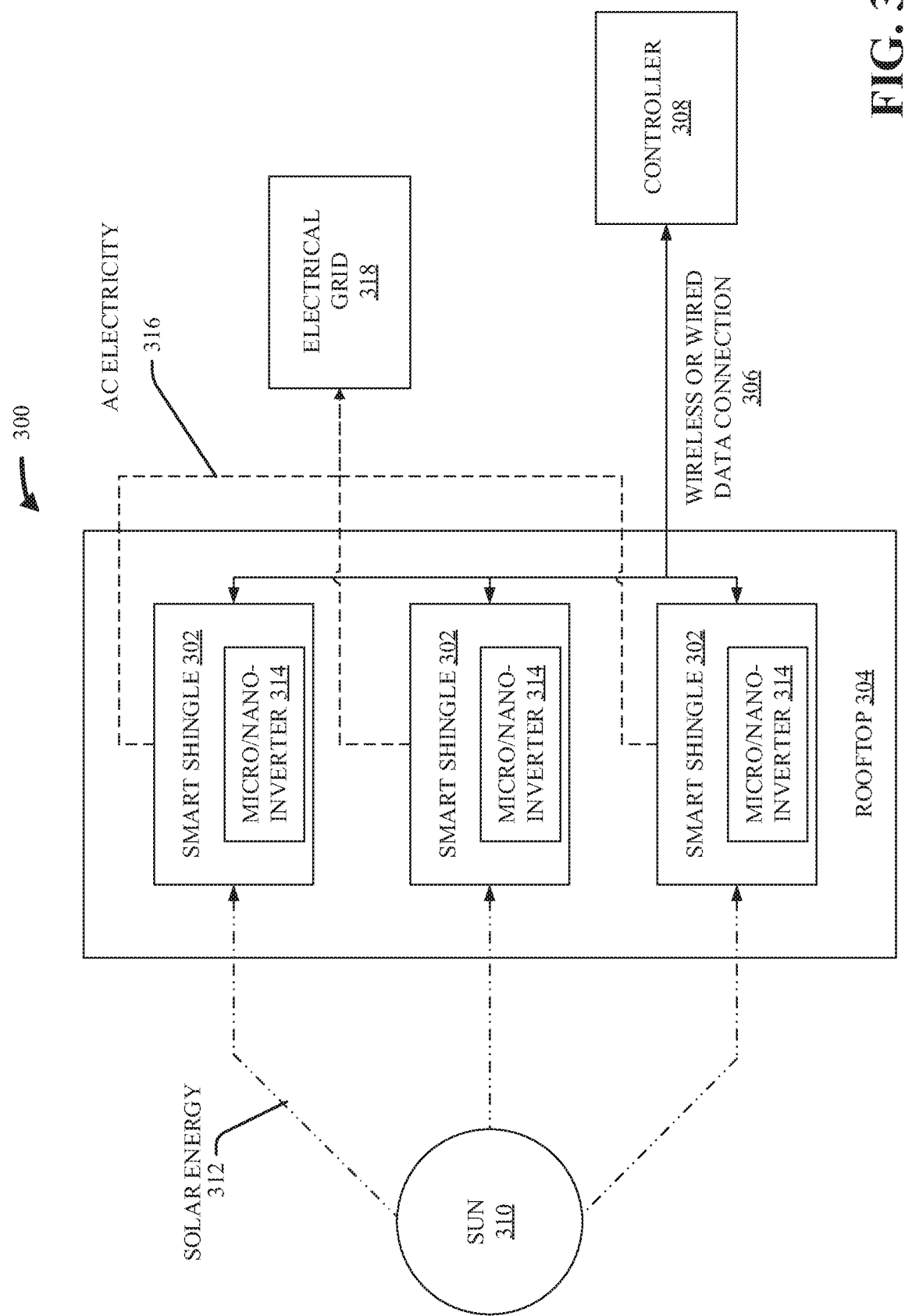
FIG. 3 illustrates a high-level functional block diagram of an example system comprising at least one smart shingle coupled to a controller and an electrical grid, wherein each smart shingle comprises its own inverter, in accordance with various aspects disclosed herein.

FIG. 3 depicts an exemplary smart shingle system 300 comprising at least one smart shingle coupled to a controller and an electrical grid in accordance with various aspects disclosed herein. FIG. 3 illustrates nearly the same high-level, exemplary system as FIG. 2. Smart shingles 302, located on rooftop 304, are communicatively connected to controller 308 via wireless or wired data connection 306. Smart shingles 302 collect solar energy 312 from sun 310 in the form of sunlight. Smart shingles 302 then convert solar energy 312 into electricity.

In an embodiment, however, each smart shingle 302 comprises its own inverter 314 to convert the DC electricity produced by the solar collector within each smart shingle 302 (not shown in the figure) into AC electricity 316. Just as in FIG. 2, AC electricity 316 may then be wholly or partially channeled to electrical grid 318, other electrical grids, and/or appliances/devices directly.

Furthermore, note that incorporating inverters 314 directly into smart shingles 302 reduces the length of power lines in smart shingle system 300 which carry DC electricity, thereby commensurately reducing transmission losses.

Moreover, note that FIG. 3 designates each inverter 314 as "micro/nano." This label simply acknowledges that smart shingles, which are designed to look and function as conventional roofing shingles, would not be able to comprise full-sized electrical inverters while remaining of approximately the same shape and size as conventional shingles. So, integrating inverters into the smart shingles makes most sense when miniaturized inverters, such as micro-inverters and/or nano-inverters, are used. However, one having ordinary skill in the art will appreciate that integrating full-sized inverters is nonetheless in accordance with this disclosure and the spirit of the subject claimed invention.

Now, as disclosed above, the subject claimed invention is compatible with smart shingles that are connected to one or more external, central inverters as well as smart shingles that comprise their own inverters. For the sake of brevity, the remaining figures depict only the latter scenario. However, one of ordinary skill in the art will appreciate that all of the subsequent disclosure is equally applicable to either embodiment of the subject claimed invention.

Figure 4:
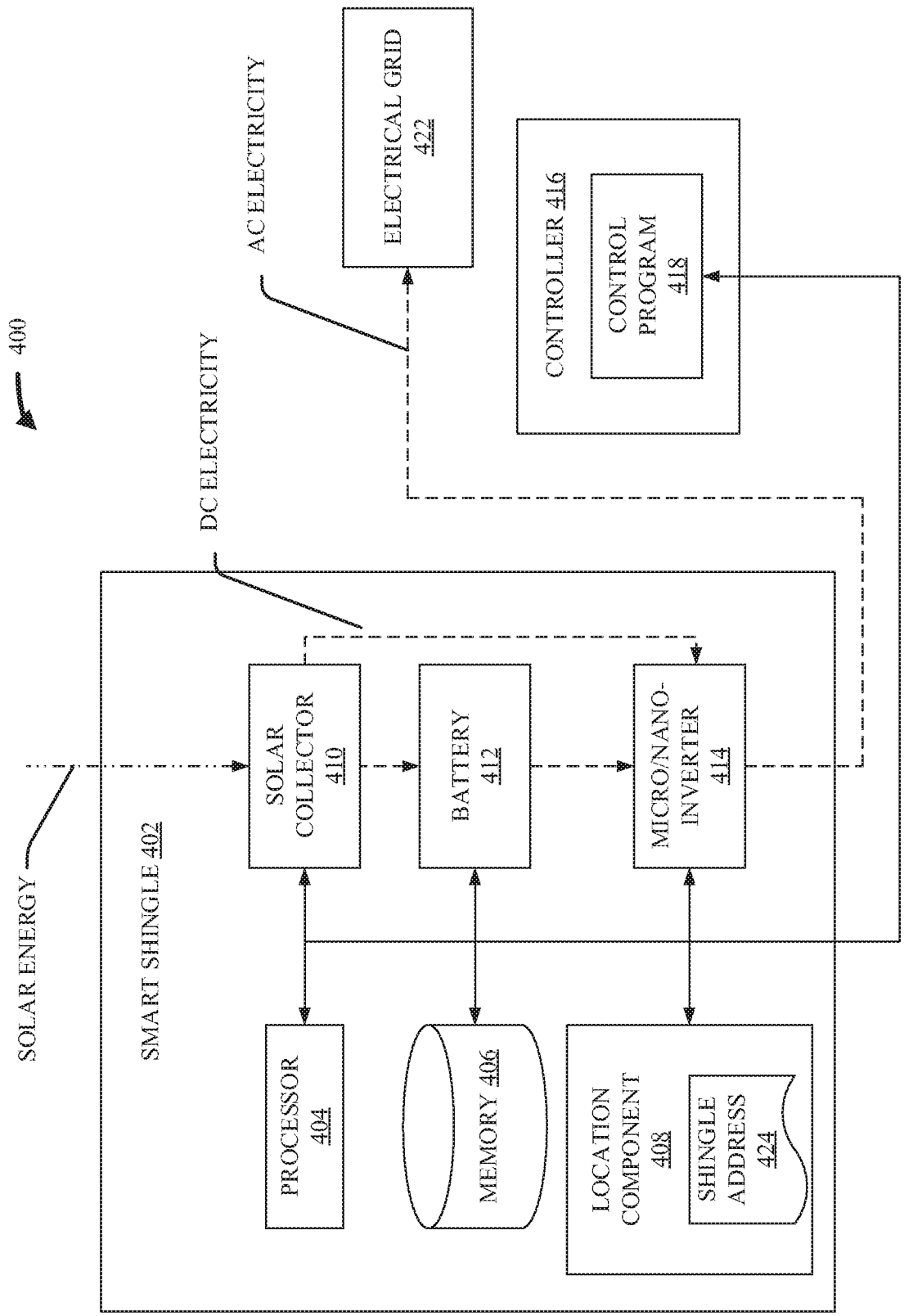
FIG. 4 illustrates a high-level functional block diagram of an example system comprising at least one smart shingle coupled to a controller, wherein the smart shingle comprises subcomponents in accordance with various aspects disclosed herein.

Now, consider FIG. 4. FIG. 4 depicts an exemplary smart shingle system 400 comprising at least one smart shingle coupled to a controller, wherein the smart shingle comprises subcomponents in accordance with various aspects disclosed herein. In other words, FIG. 4 illustrates some specific details of the smart shingle systems shown in FIG. 2 and FIG. 3. As shown, smart shingle 402 is communicatively connected to controller 416 by wireless or wired data connection 420, just as in previous figures. As explained above, wireless or wired data connection 420 can comprise any method suitable for electronic communication, such as Ethernet, USB, Micro USB, Mini USB, Lightning™ port, wireless bus, Bluetooth™, etc.

As shown, controller 416 comprises control program 418, which may contain at least one smart shingle monitoring protocol to be performed by controller 416. In short, control program 418 comprises the software instructions which controller 416 may execute in order to monitor the at least one smart shingle 402. Controller 416 and its various subcomponents will be explained in detail in connection with FIG. 20-25 below. For now, consider smart shingle 402.

As shown, smart shingle 402 comprises electronic processor 404 and computer-readable memory 406. In one embodiment, processor 404 is capable of executing and/or facilitating execution of various components and/or portions of components stored in computer-readable memory 406. In another aspect, electronic processor 404 and memory 406 are able to execute and/or facilitate execution of some or all of the various other subcomponents comprised by smart shingle 402.

In one embodiment, smart shingle 402 further comprises location component 408. As shown, location component 408 ultimately stores shingle address 424. Shingle address 424 represents the location and/or coordinates of smart shingle 402 in relation to other smart shingles in the smart shingle system. As mentioned above, shingle address 424 may be leveraged in some embodiments in order to perform automated, expedient, and accurate system diagnostics. For example, controller 416 can use each smart shingle 402's shingle address 424 to automatically map (i.e. automap) the smart shingles 402 in relation to each other. This automap information would then reveal which smart shingles 402 are neighbors, thus allowing controller 416 to compare and contrast the operating conditions of neighboring smart shingles 402 in order to detect and identify damaged and/or obstructed shingles. Note that the form of shingle address 424 is immaterial. In other words, shingle address 424 may be any information which can be used to distinguish the position/location of smart shingle 402 from the position/location of other smart shingles in the smart shingle system, including, for example, a name/number, Cartesian coordinates, geographical coordinates (i.e. latitude, longitude, and/or elevation), etc.

In one aspect, location component 408 may be directly given shingle address 424 by a user/manufacturer. For instance, a user can simply interact with controller 416 in order to assign smart shingle 402 a particular shingle address 424. As an example, the user may enter shingle address 424 of smart shingle 402 by using a computer screen and/or keyboard/keypad, touch pad, and/or the like that is attached to controller 416. Alternatively, the user may remotely enter shingle address 424 by using a phone, computer, and/or other device, wherein the phone, computer, or device is in wireless communication with controller 416. In these cases, location component 408 acts simply as a memory component. So, in such embodiment, the shingle address 424 may be stored directly in computer-readable memory 406, obviating the need for location component 408. Alternatively, location component 408 may serve as an interface to allow the user to interact directly with smart shingle 402 rather than through controller 416. In such case, location component 408 may take the form of any suitable interface device, including, for example, a computer screen and/or keyboard/keypad, a touch-screen, and/or the like that is physically attached/connected to smart shingle 402. In another embodiment, location component 408 may comprise a wireless communication device (i.e. Bluetooth™) that would allow a user to interact with smart shingle 402 via a remote device (i.e. phone, PDA, tablet, laptop, desktop, etc.). For example, a user may remotely enter shingle address 424 of smart shingle 402 by using his/her phone, computer, and/or other device, wherein the phone, computer, or device is in wireless communication with smart shingle 402 via location component 408.

In another embodiment, however, location component 408 can actively determine shingle address 424 without manual intervention by a user. Such an embodiment would further improve the automation of the smart shingle system by obviating the need for a user to manually assign shingle address 424. Although manually assigning a single shingle address is not necessarily overly burdensome, a building can easily require hundreds of shingles, and manually assigning shingle addresses to each of them can certainly be tedious and time-consuming.

There are various ways by which location component 408 can determine shingle address 424. In one embodiment, location component 408 may comprise a global positioning system (GPS) sensor/receiver. A GPS sensor/receiver receives the radio waves broadcast by various satellites orbiting the Earth, wherein the radio waves contain information specifying a particular satellite's position and time at which the radio wave was sent. Using this information, the GPS sensor/receiver can estimate the distance between itself and the satellite. The GPS receiver uses the information in the radio waves of multiple satellites in order to approximate its own position (i.e. latitude, longitude, and elevation) on the planet. Alternatively, if GPS satellites are unavailable, location component 408 may receive signals from nearby cell towers or the like in order to determine its location. Said location is then stored as shingle address 424.

In another embodiment, the smart shingle system can be outfitted with signal transmitters positioned at known reference locations (i.e. on the ground, at the highest point of the roof, at the corners of the roof, etc.). In such case, each location component 408 can comprise a signal sensor/receiver, very similar to the GPS sensor/receiver as described above, wherein the location component 408 can receive radio waves and/or other electromagnetic signals from the transmitters and use said radio waves and/or signals to determine each smart shingle 402's distance from each reference. By utilizing multiple reference transmitters, each smart shingle 402 can approximate its position on the roof and store said position as shingle address 424.

In yet another embodiment, location component 408 may comprise a signal transmitter, receiver, and/or transceiver, such that location component 408 can both transmit and receive radio waves and/or other electromagnetic signals from other smart shingles in the smart shingle system. In other words, the location component 408 of each smart shingle 402 would continuously (or less frequently, if desired) emit radio waves and/or other electromagnetic signals and receive said waves/signals from other smart shingles. In such case, each smart shingle 402 of a smart shingle system would have a location component 408 in continuous (or less frequently, in an embodiment) communication with the location components of other smart shingles. By using the same principles of triangulation which enable GPS to function, each smart shingle 402 would be able to approximate the distance between itself and the other smart shingles. This information could then be used to determine the relative position of each smart shingle 402.

In various other embodiments, location component 408 can comprise any other type of suitable device or devices which would facilitate the use of radiodetermination (i.e. radiolocation, radio frequency navigation, radar, etc.) to allow each smart shingle 402 to determine either its absolute position on the rooftop and/or its relative position in relation to the other smart shingles in the smart shingle system. In any case, each smart shingle 402 is able to continuously (or less frequently, in an embodiment) monitor its absolute and/or relative position. Although roofing shingles are designed to be stationary, the continuous or semi-continuous monitoring of position by location component 408 would allow the smart shingle system to immediately notify a user if any smart shingle 402 were dislodged, blown off, or otherwise removed from the rooftop, such as by a storm.

As shown in FIG. 4, smart shingle 402 further comprises solar collector 410. As mentioned above, solar collector 410 converts solar energy (gathered from sunlight) into DC electricity that can be utilized in useful applications. Solar collector 410 accomplishes this by way of the photo-electric effect.

Solar collector 410 can comprise any photovoltaic cell, module, panel, and/or array, or any combination thereof. Furthermore, solar collector 410 may be composed of any suitable photovoltaic material, or any combination of suitable photovoltaic materials, and arranged, created, and/or manufactured by any method known in the art. Suitable photovoltaic materials include, but are not limited to, monocrystalline silicon, polycrystalline silicon, thick-film silicon, thin-film/amorphous silicon, gallium arsenide, cadmium telluride, copper indium diselenide, copper indium gallium diselenide, perovskite-based compounds, etc. As one of ordinary skill in the art will appreciate, each material has its own advantages and disadvantages (i.e. cost, efficiency, etc.), and so the material chosen may depend on fact-specific circumstances and/or the preferences of the user.

Moreover, each smart shingle 402 in the smart shingle system need not have identical solar collectors 410. For example, one or more groups of smart shingles 402 located on a particular part of the rooftop may comprise solar collectors 410 composed of a certain photovoltaic material while one or more other groups of smart shingles 402 located on a different portion of the rooftop (possibly with a different orientation or slope) may comprise solar collectors 410 composed of different photovoltaic materials. Such an embodiment could allow the user to take advantage of cost and efficiency differentials to obtain a desired power output at a given price. For instance, a user may decide to use more efficient photovoltaic materials in smart shingles that are located on portions of the rooftop that are not ideally situated to receive the most direct sunlight while electing to use less expensive (and, therefore, less efficient) photovoltaic materials in smart shingles that are located on portions of the rooftop that tend to get longer and/or more direct sunlight. In such an embodiment, the different groups of smart shingles could produce similar amounts of electricity despite receiving different amounts of sunlight. In this way, the user may customize the smart shingle system to suit his/her financial and energy needs.

In order to collect sunlight, solar collector 410 must be integrated within smart shingle 402 in such a way so as to allow the sun to shine upon it. To accomplish this, solar collector 410 may be located on or near the top surface of smart shingle 402 and/or protected by a glass, plastic, and/or other at least partially transparent covering. One having ordinary skill in the art will appreciate that other ways of exposing solar collector 410 to sunlight are possible and in accordance with this disclosure.

Moreover, since conventional solar shingles already contain solar collectors, one having ordinary skill in the art will appreciate that any material, component, method, construction, technique, and/or the like known in the art may be utilized to integrate solar collector 410 into smart shingle 402.

In another embodiment, smart shingle 402 further comprises inverter 414. As explained above, keeping the size of smart shingle 402 comparable to the size of a conventional roofing shingle makes the integration of a full-sized inverter into smart shingle 402 impractical. So, it is more appropriate to use a micro/nano-inverter if smart shingle 402 is to comprise its own inverter. However, one or more central inverters may be located outside of smart shingle 402 if desired, thereby obviating the need for an internal inverter. In either case, solar collector 410 generates DC electricity and transmits said electricity to the one or more inverters (inverter 414 in the embodiment illustrated in FIG. 4). Inverter 414 then converts the DC electricity into AC electricity, which can then be fed to electrical grid 422, other grids, and/or appliances/devices directly.

In one embodiment, smart shingle 402 comprises battery 412. Battery 412 can be used to temporarily store the electrical energy harvested by solar collector 410 as well as to help power some or all of the various electricity-consuming subcomponents of smart shingle 402. For example, if any electronic, power-consuming subcomponents of smart shingle 402 are not powered down during nighttime hours, they may be wholly or partially powered by battery 412. As another example, battery 412 may be used to wholly or partially power any of the electronic subcomponents of smart shingle 402 during daylight hours on an exceedingly cloudy day.

As one of ordinary skill in the art will appreciate, the chemical composition of battery 412 is immaterial; any battery of appropriate size can be integrated within smart shingle 402 by any method known in the art. Furthermore, although making battery 412 non-rechargeable is not the most sensible embodiment, it is still in accordance with this disclosure and the spirit of the subject claimed invention.

In another embodiment, battery 412 can comprise a capacitor, super-capacitor, and/or any other device capable of storing and discharging electrical energy.

In another embodiment, battery 412 can be located outside smart shingle 402 and can even be one of one or more central batteries for the entire smart shingle system. For example, instead of integrating a battery into each smart shingle 402, one or more central batteries may be integrated into the smart shingle system such that the one or more batteries receive electricity from all or a subset of the smart shingles 402 in the smart shingle system. Such central batteries could then be used to power various appliances, devices, and/or applications within the building.

Figure 5:
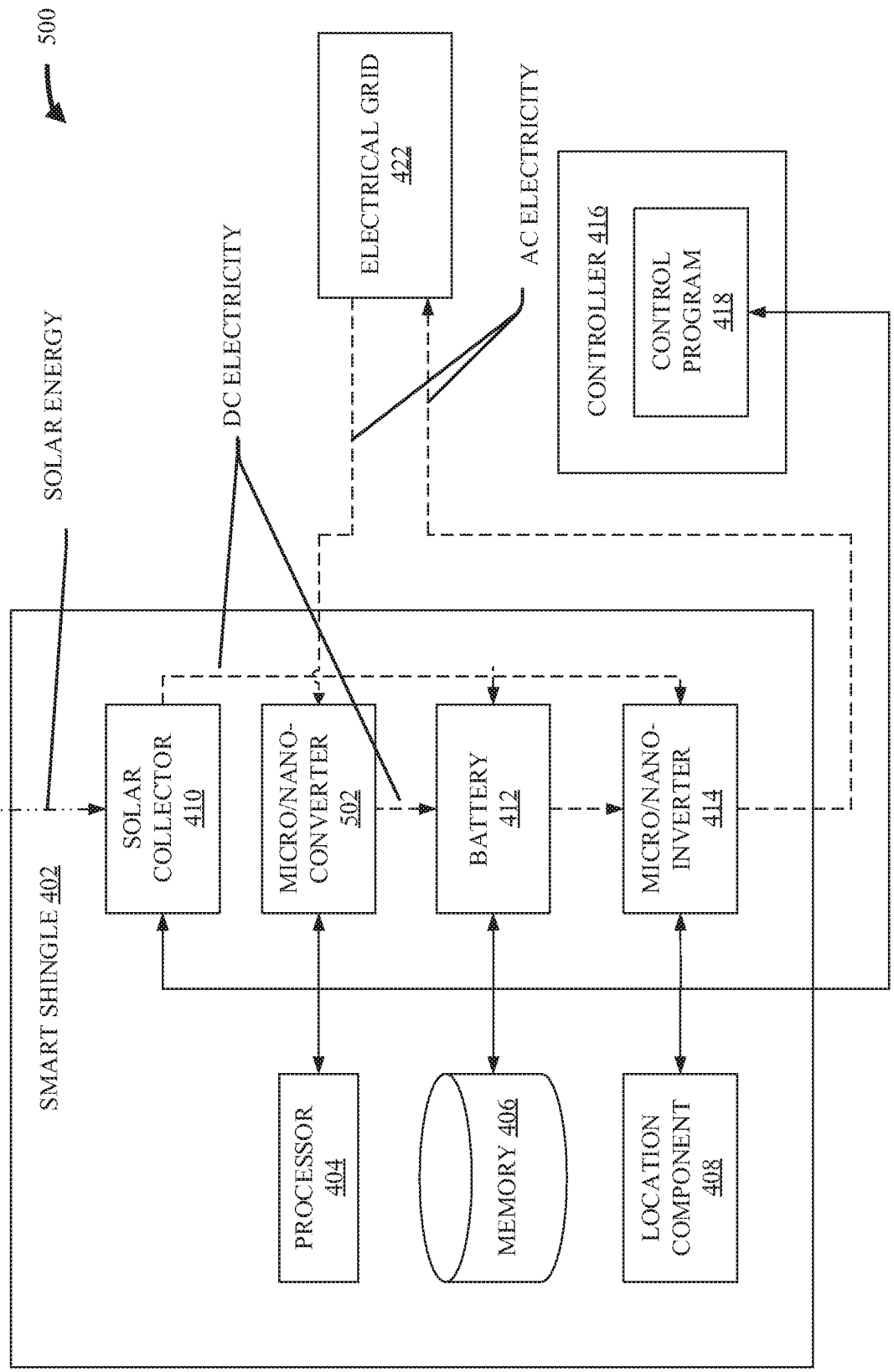
FIG. 5 illustrates a high-level functional block diagram of an example system comprising at least one smart shingle coupled to a controller, wherein the smart shingle comprises a converter in accordance with various aspects disclosed herein.

Now, consider FIG. 5. FIG. 5 depicts an exemplary smart shingle system 500 comprising at least one smart shingle coupled to a controller in accordance with various aspects disclosed herein. As shown, FIG. 5 illustrates nearly the same smart shingle system as FIG. 4. Smart shingle 402 is communicatively linked to controller 416 via wireless or wired data connection 420. Smart shingle 402 comprises electronic processor 404, computer-readable memory 406, location component 408 which comprises shingle address 424 (not shown in FIG. 5), solar collector 410, battery 412, and inverter 414. Just as in FIG. 4, inverter 414 receives DC electricity from solar collector 410 and feeds AC electricity to electrical grid 422.

Notice, however, that, in an embodiment, smart shingle 402 can comprise converter 502, as shown in FIG. 5. Converter 502 is the functional inverse of inverter 414. That is, while inverter 414 converts DC electricity to AC electricity, converter 502 converts AC electricity to DC electricity. In this way, AC electricity from electrical grid 422 can be received by converter 502, converted into DC electricity, and then used to charge battery 412 and/or to power some or all of the electronic, power-consuming subcomponents of smart shingle 402. As one of ordinary skill in the art will appreciate, AC electricity from electrical grid 422 may be channeled directly into any power-consuming subcomponent of smart shingle 402 if such subcomponent can accept AC electricity, thereby possibly obviating the need for converter 502. In either case, controller 416, or possibly smart shingle 402 itself, can control when converter 502 channels electricity into smart shingle 402.

Just as with inverters, converter 502 may be located inside or outside smart shingle 402. In the case of an external converter, one or more central converters may be utilized to accept AC electricity from electrical grid 422 and send DC electricity to one or more smart shingles 402 in the smart shingle system. However, since transmission loses are greater for DC electricity than for AC electricity, the embodiment illustrated in FIG. 5 may be a more efficient embodiment.

Moreover, just like inverter 414, converter 502 has the label "micro/nano" in order to acknowledge that integrating a full-sized electrical converter into smart shingle 402 would likely conflict with the goal of keeping the size of smart shingle 402 comparable to that of a conventional roofing shingle. So, it is more sensible to use a miniaturized converter, such as a micro-converter and/or nano-converter, if converter 502 is to be integrated within smart shingle 402. Nevertheless, integrating a full-sized converter is in accordance with this disclosure and the spirit of the subject claimed invention.

Figure 6:
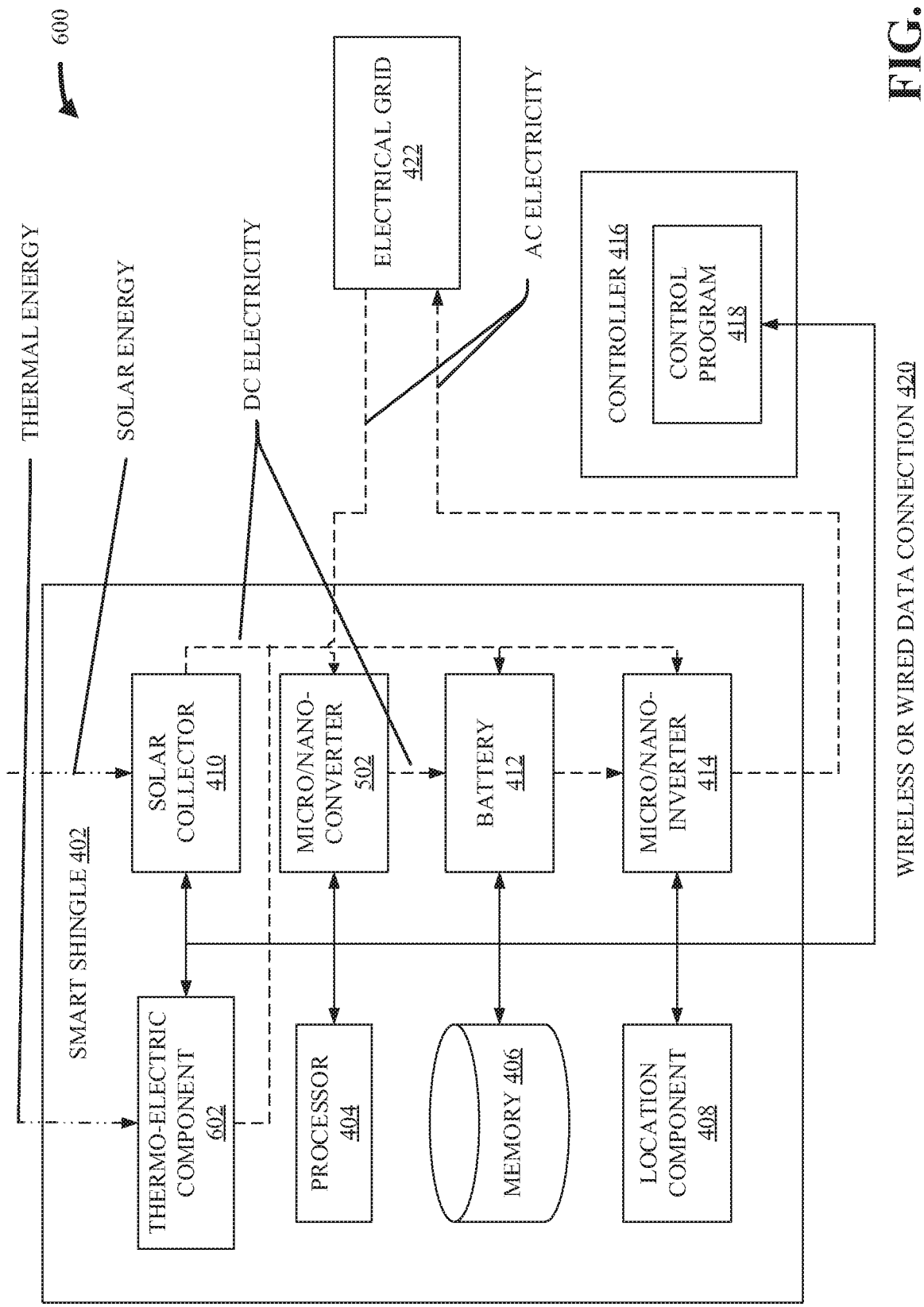
FIG. 6 illustrates a high-level functional block diagram of an example system comprising at least one smart shingle coupled to a controller, wherein the smart shingle comprises a thermo-electric component in accordance with various aspects disclosed herein.

Now, consider FIG. 6. FIG. 6 depicts an exemplary smart shingle system 600 comprising at least one smart shingle coupled to a controller in accordance with various aspects disclosed herein.

As shown, FIG. 6 illustrates nearly the same smart shingle system as FIG. 5. Notice, however, that, in an embodiment, smart shingle 402 can comprise thermo-electric component 602. As shown in FIG. 6, thermo-electric component 602 absorbs thermal energy and generates DC electricity, which can then be channeled to inverter 414 and/or battery 412. Thermo-electric component 602 converts heat fluxes (i.e. temperature differentials) into electricity via the thermo-electric effect. For example, thermo-electric component 602 may absorb radiation from the sun and use that excess heat to generate additional electricity. Such capability could be highly effective and beneficial during summer months since the sun generally shines longer and more brightly in the summer. In another example, thermo-electric component 602 can absorb heat directly from the building and use that excess heat to generate additional electricity. Taking advantage of temperature differences within the building itself could be quite effective and beneficial during winter months since buildings and homes are generally heated in the winter and tend to experience much heat loss through their roofs.

To accomplish this, thermo-electric component 602 may comprise any suitably-sized thermo-electric generator and/or Seebeck generator known in the art that is composed of any suitable thermo-electric materials known in the art. For example, thermo-electric component 602 may be composed of: bismuth telluride; lead telluride; silicon germanium; any alloys, semiconductors, complex crystals, and/or multiphase nanocomposites whose thermo-electric properties have been augmented using nanotechnology; etc.

Thermo-electric component 602 essentially diversifies the sources of energy which smart shingle 402 may tap to generate electricity. In this way, thermo-electric component 602 enables smart shingle 402 to create more electric power than it otherwise would. Moreover, thermo-electric component 602 also allows smart shingle 402 to continue generating electricity even if one source of energy is temporarily unavailable. For example, smart shingle 402 can continue generating electricity on a dark winter night if there is a sufficient temperature differential in the building (i.e. the interior of the building is heated in the winter while the exterior of the building is exposed to outdoor winter temperatures). In another example, smart shingle 402 can continue generating electricity via thermo-electric component 602 during daylight hours in the winter even if smart shingle 402 is covered by snow and/or ice (i.e. solar collector 410 is obstructed). As yet another example, smart shingle 402 can continue generating electricity on a hot summer day via thermo-electric component 602 even if it is exceedingly cloudy or solar collector 410 is otherwise obstructed. As can be appreciated, incorporating thermo-electric component 602 potentially greatly improves smart shingle 402's versatility and effectiveness.

Now, as mentioned above, smart shingle 402 can be outfitted with a variety of one or more sensors to enable it to automatically detect and interact with its surroundings. The next several figures illustrate such potential embodiments. One skilled in the art will appreciate, however, that not all illustrated sensors must be incorporated into any one embodiment and that various other sensors known in the art but not shown in the figures may be incorporated into a smart shingle system in accordance with this disclosure and the spirit of the subject claimed invention. Furthermore, one having ordinary skill in the art will appreciate that the subject claimed invention encompasses any combination and/or permutation of the subcomponents shown in the next several figures, rather than merely the embodiments illustrated.

Figure 7:
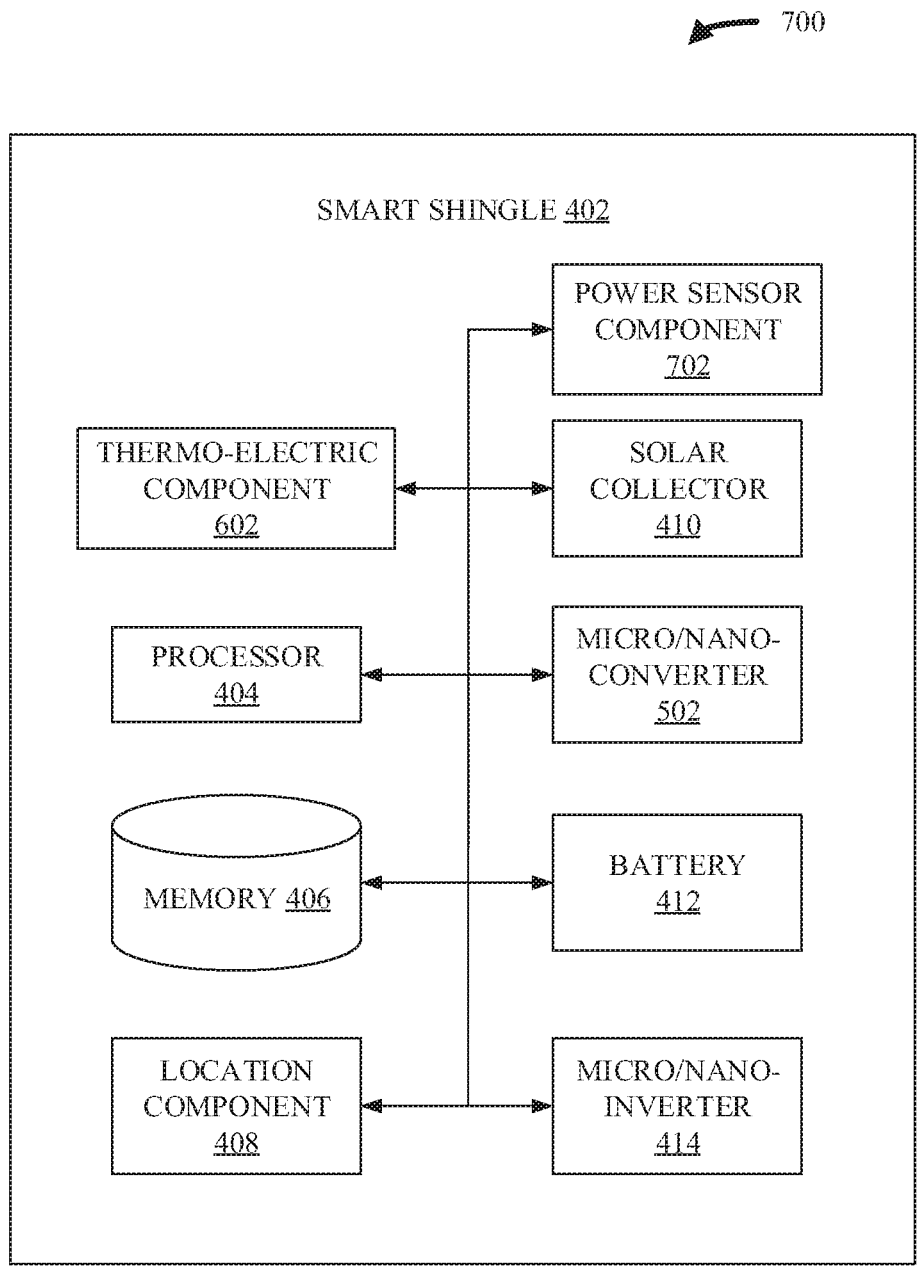
FIG. 7 illustrates a high-level functional block diagram of an example smart shingle comprising a power sensor component in accordance with various aspects disclosed herein.

Consider FIG. 7. FIG. 7 depicts an exemplary smart shingle system 700 comprising at least one smart shingle in accordance with various aspects disclosed herein.

As shown, FIG. 7 illustrates nearly the same smart shingle 402 as does FIG. 6. In one embodiment, however, smart shingle 402 can comprise power sensor component 702. Power sensor component 702 can detect the level of real-time, average, and/or historical electric power generation from solar collector 410 and/or thermo-electric component 602 (if present). This embodiment would account for all of the electricity produced by smart shingle 402. Alternatively, or possibly concurrently, power sensor component 702 can monitor the electric power generated by inverter 414, which represents the total power generated by smart shingle 402 that is sent to the electrical grid and/or appliances. Note, however, that the latter embodiment would not account for any electricity generated by smart shingle 402 that is used to charge battery 412 or to directly power some or all of the electricity-consuming subcomponents of smart shingle 402. Moreover, power sensor component 702 can also be used to monitor the amount of electricity consumed by smart shingle 402 via converter 502. In this way, power sensor component 702 can determine the net power generation and/or consumption of smart shingle 402.

By noting the instantaneous, average, and/or historical power output/consumption of smart shingle 402, the smart shingle system can monitor its own performance. This information can then be used by controller 416 (or possibly by smart shingle 402 itself) to help perform system diagnostics. For example, controller 416, which monitors the at least one smart shingle 402, can notify the user when one or more smart shingles 402 experiences a significant and/or unexpected increase and/or decrease in power generation and/or consumption. For instance, power generation is expected to vary approximately as a sinusoid throughout the day (i.e. lower power generation in the morning when the sun is rising, higher power generation around noon when the sun is high, and lower power generation again in the evening when the sun is setting, etc.). However, controller 416 may notify the user when the power generation of smart shingle 402 is significantly higher and/or lower than it should be, such as if the power generation around noon were lower than in the morning and/or evening, for example. In another example, controller 416 (or possibly smart shingle 402 itself) can leverage both the resulting net power generation determined by power sensor component 702 and shingle address 424 (not shown in FIG. 6) to perform system diagnostics. For example, controller 416 can notify a user when power sensor component 702 of a certain smart shingle 402 indicates a much lower overall power output than those of neighboring smart shingles. Such a scenario may suggest that smart shingle 402 is damaged and/or obstructed since smart shingle 402 is presumably expected to have a similar power output as compared to neighboring shingles. Note, however, that this may not hold if neighboring smart shingles possess different solar collectors with different efficiency ratings. In such case, controller 416 (or possibly smart shingle 402 itself) can compensate for the difference by notifying the user when there is a change in the difference between power output rates of neighboring smart shingles, as opposed to notifying the user merely that unequal power outputs are detected.

In order to measure power output/consumption, power sensor component 702 can comprise one or more electric voltage and/or electric current sensors as known in the art. Such devices can measure the root-mean-square voltage differences and/or root-mean-square currents between two or more electrical connections. By incorporating them into smart shingle 402, the voltages and currents produced/consumed by solar collector 410, thermo-electric component 602, inverter 414, and/or converter 502 can be determined and then stored either in power sensor component 702 or computer-readable memory 406. The electrical power generated and/or consumed by smart shingle 402 can then be calculated according to the known formula: electrical power equals current multiplied by voltage.

Figure 8:
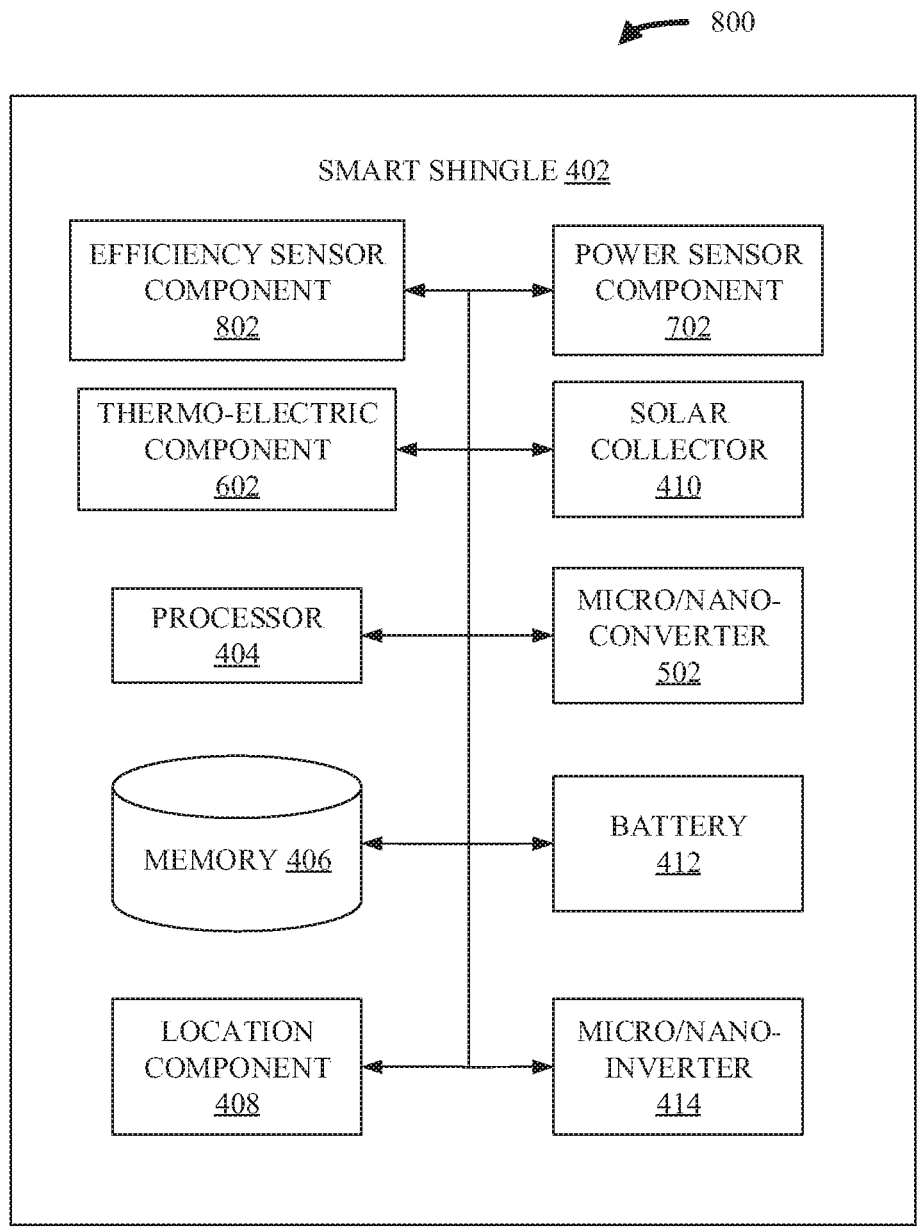
FIG. 8 illustrates a high-level functional block diagram of an example smart shingle comprising an efficiency sensor component in accordance with various aspects disclosed herein.

Now, consider FIG. 8. FIG. 8 depicts an exemplary smart shingle system 800 comprising at least one smart shingle in accordance with various aspects disclosed herein.

As shown, FIG. 8 illustrates nearly the same smart shingle 402 as does FIG. 7. In one embodiment, however, smart shingle 402 can comprise efficiency sensor component 802. Efficiency sensor component 802 can determine how efficiently smart shingle 402 (or any subcomponent thereof, as explained above in connection with power sensor component 702) converts solar and/or thermal energy into electricity.

By noting the instantaneous, average, and/or historical efficiency of smart shingle 402, the smart shingle system can more accurately and completely monitor its performance. As explained above, this information can be used by controller 416 (or possibly by smart shingle 402 itself) to help perform system diagnostics. For example, controller 416, which monitors the at least one smart shingle 402, can notify the user when one or more smart shingles 402 experiences a significant and/or unexpected increase and/or decrease in energy conversion efficiency. For instance, controller 416 (or possibly smart shingle 402 itself) can notify a user if efficiency sensor component 802 indicates that the efficiency of smart shingle 402 is significantly higher and/or lower than those of its neighboring smart shingles. A notably lower efficiency level may suggest that smart shingle 402 is in some way defective. Note, however, that this may not hold if neighboring smart shingles possess different solar collectors with different efficiency ratings. In such case, controller 416 (or possibly smart shingle 402 itself) can compensate for the difference in efficiency by notifying the user if there is any change in the difference between efficiencies of neighboring smart shingles, as opposed to notifying the user merely that unequal efficiencies are detected. Moreover, note that the efficiency of a smart shingle should not vary as much throughout a day as would power output. After all, the power produced by smart shingle 402 should remain proportional to the solar energy collected, no matter how much solar energy that is.

In order to measure efficiency, efficiency sensor component 802 can comprise a device similar to power sensor component 702 (if power sensor component 702 is absent) and any type of suitably-sized solar radiation sensor known in the art, such as an actinometer, pyranometer, pyrheliometer, net radiometer, etc. Furthermore, efficiency sensor component 802 can also comprise any device and/or sensor known in the art that can measure the amount of heat energy collected by thermo-electric component 602. The device that is similar to power sensor component 702 will determine the power output of smart shingle 402. If power sensor component 702 is not absent, efficiency sensor component 802 can simply leverage the power output determined by power sensor component 702. The solar radiation sensor, on the other hand, will determine the solar radiation flux density of any incident sunlight. Solar radiation power can then be obtained by multiplying the solar radiation flux density by the exposed surface area of solar collector 410. Alternatively, one or more solar radiation sensors can be integrated into the smart shingle system outside of smart shingle 402. In such an embodiment, the solar radiation flux density that is measured by the one or more external solar radiation sensors can be leveraged by efficiency sensor component 802. In any case, by determining both the electrical power output of smart shingle 402 as well as the amount of energy received by smart shingle 402 in the form of solar radiation and/or heat, efficiency can be calculated according to the known formula: efficiency equals power output divided by power input (i.e. solar radiation and heat received).

Figure 9:
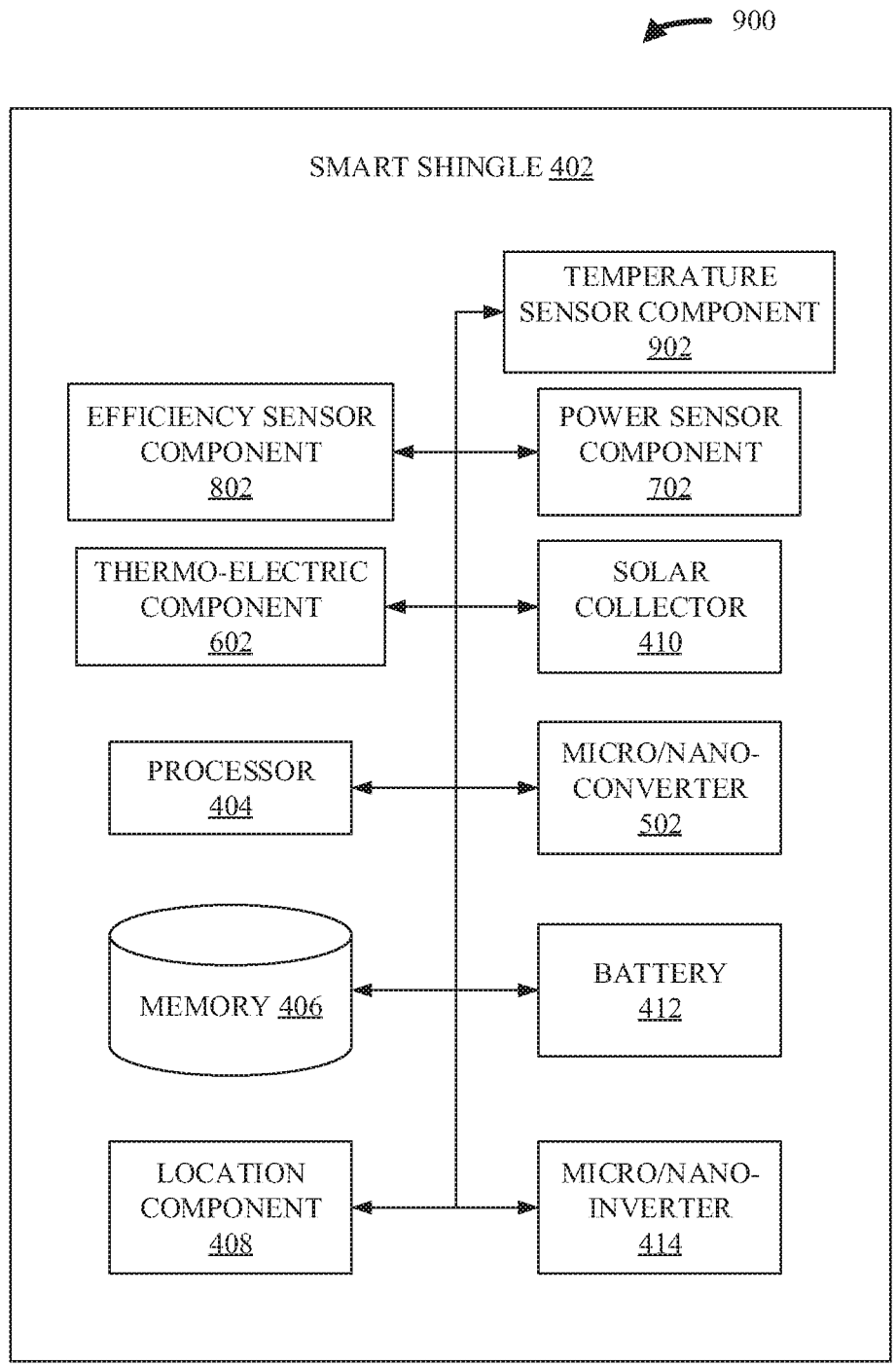
FIG. 9 illustrates a high-level functional block diagram of an example smart shingle comprising a temperature sensor component in accordance with various aspects disclosed herein.

Now, consider FIG. 9. FIG. 9 depicts an exemplary smart shingle system 900 comprising at least one smart shingle in accordance with various aspects disclosed herein.

As shown, FIG. 9 illustrates nearly the same smart shingle 402 as does FIG. 8. In one embodiment, however, smart shingle 402 can comprise temperature sensor component 902. Temperature sensor component 902 can determine the temperature of the exposed surface of smart shingle 402. In another embodiment, temperature sensor component 902 can also determine the ambient, outdoor temperature. Furthermore, temperature sensor component 902 can possibly determine the average and/or historical temperatures of the smart shingle surface and/or ambient surroundings as well as the corresponding real-time temperatures.

By noting the instantaneous, average, and/or historical temperatures of the surface of smart shingle 402 as well as possibly its ambient surroundings, the smart shingle system can more accurately and completely monitor its performance. For example, smart shingle 402 can leverage the information measured by temperature sensor component 902 to approximate the weather to which smart shingle 402 is exposed. For instance, if temperature sensor component 902 measures a temperature below 32° F. (0° C.), controller 416 (or possibly smart shingle 402 itself) can notify the user that it is possibly snowing outside. In this case, the user would be put on notice that he/she may have to clear away snow and/or ice build-up from the smart shingle system. As another example, smart shingle 402 may be able to leverage the information measured by temperature sensor component 902 to estimate the time of day. For instance, since the ambient temperature outside generally follows a sinusoidal path (i.e. lower in the morning when the sun is rising, higher in the afternoon when the sun is high, lower again in the evening when the sun is setting, and lowest at night when the sun is not out), temperature sensor component 902 may be able to indicate the approximate time of day. This information can then be used in conjunction with power sensor component 702 to conduct system diagnostics. In this case, controller 416 (or possibly smart shingle 402 itself) could compare the measured power output with the estimated time of day in order to determine if smart shingle 402 is producing an appropriate amount of electricity given the outdoor temperature and likely sunlight. Although efficiency sensor component 802 serves a similar purpose (i.e. validating that smart shingle 402 is producing an appropriate amount of power), this particular embodiment could be used to verify the measurements of efficiency sensor component 802, thereby providing system redundancy and fail-safety. Temperature sensor component 902 may also be able to validate the efficiency measurements concerning thermo-electric component 602.

In order to measure the temperatures of the surface of smart shingle 402 and/or the ambient air, temperature sensor component 902 can comprise one or more suitably-sized thermocouples, thermometers, infrared thermometers, and/or any other device known in the art that can measure the temperature of an object and/or ambient air. The measured temperatures can then be stored directly in temperature sensor component 902 and/or in computer-readable memory 406. In another embodiment, one or more central temperature sensors can be integrated into the smart shingle system outside of smart shingle 402 (i.e. one or more thermometers may be located somewhere on the rooftop but outside any smart shingle). In such case, temperature sensor component 902 and/or computer-readable memory 406 can receive and/or store said information.

Figure 10:
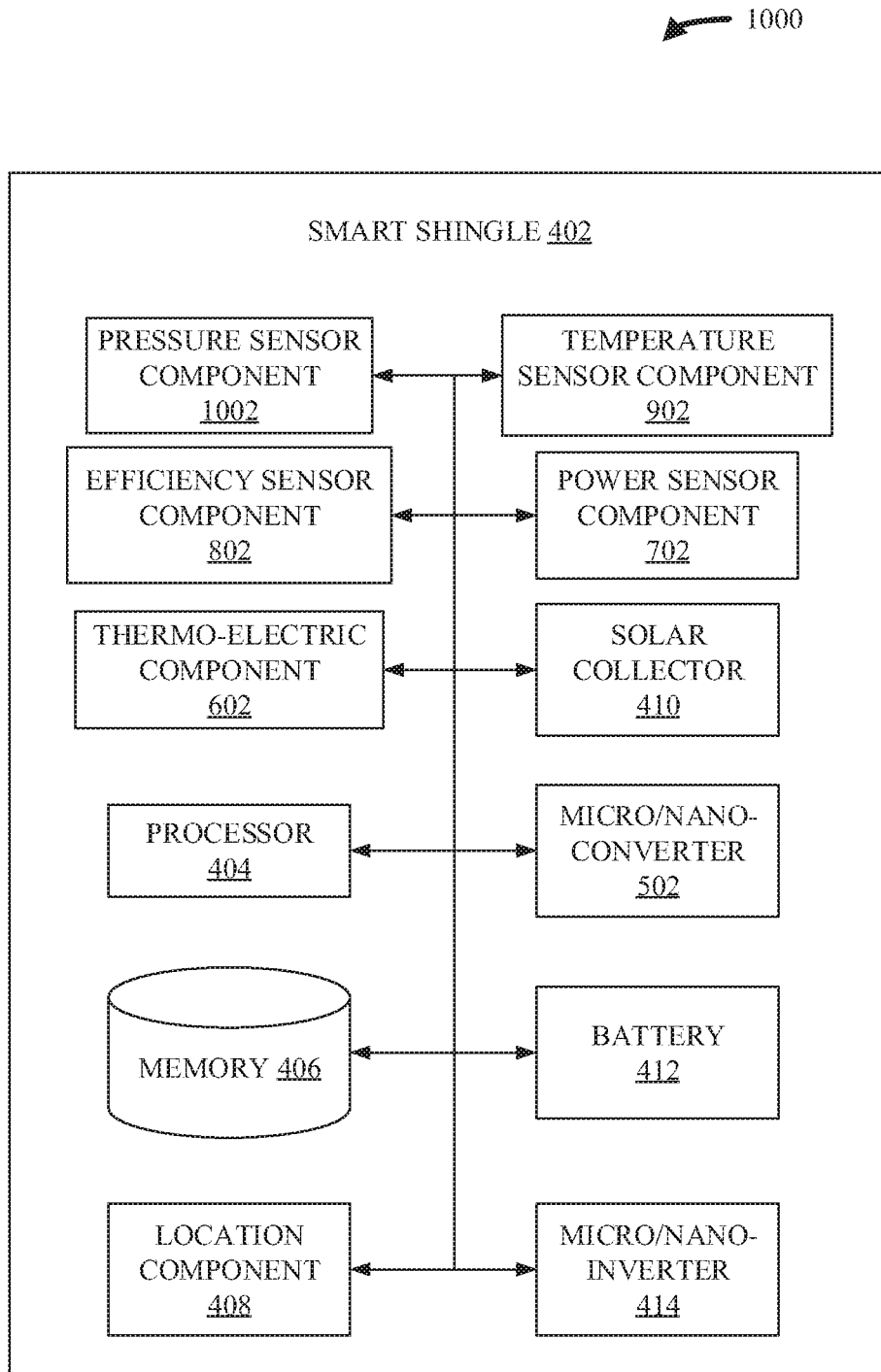
FIG. 10 illustrates a high-level functional block diagram of an example smart shingle comprising a pressure sensor component in accordance with various aspects disclosed herein.

Now, consider FIG. 10. FIG. 10 depicts an exemplary smart shingle system 1000 comprising at least one smart shingle in accordance with various aspects disclosed herein.

As shown, FIG. 10 illustrates nearly the same smart shingle 402 as does FIG. 9. In one embodiment, however, smart shingle 402 can comprise pressure sensor component 1002. Pressure sensor component 1002 can determine the amount of pressure (gauge and/or absolute pressure) being applied to the top and/or other surfaces of smart shingle 402. Alternatively, and possibly concurrently, pressure sensor component 1002 can determine the weight (i.e. amount of force) being applied to the top or other surfaces of smart shingle 402 either by measuring force directly or by multiplying measured pressure by the area of the affected surface.

By noting the instantaneous, average, and/or historical pressures/forces applied to various surfaces of smart shingle 402, the smart shingle system can more accurately and completely monitor its performance. For example, controller 416 (or possibly smart shingle 402 itself) can leverage the information measured by pressure sensor component 1002 in order to determine whether something is resting on top of smart shingle 402. For instance, the very fact that pressure sensor component 1002 is activated suggests that something is resting on top of (or otherwise pressing against a surface of) smart shingle 402, and the amount of pressure/weight measured can indicate what that object might be. For example, a light pressure/weight reading may indicate something small, such as a squirrel, bird, bird droppings, leaves, etc., while a heavy pressure/weight reading may indicate a tree branch, snow/ice, etc. In such case, controller 416 (or possibly smart shingle 402 itself) can notify the user that something is likely resting on top of, and thereby obstructing, smart shingle 402. In another example, a constant pressure/weight reading may indicate that the pressure/weight is caused by a stationary, tangible object (which, again, may need to be cleared) whereas a transient and/or constantly varying pressure/weight reading may indicate pressure induced by a strong wind.

In order to measure these pressures and/or forces, pressure sensor component 1002 can comprise any suitably-sized scale, strain gauge, piezoelectric sensor, and/or any other device known in the art that can measure pressure and/or force. The measured pressures/weights can then be stored directly in pressure sensor component 1002 and/or in computer-readable memory 406.

Figure 11:
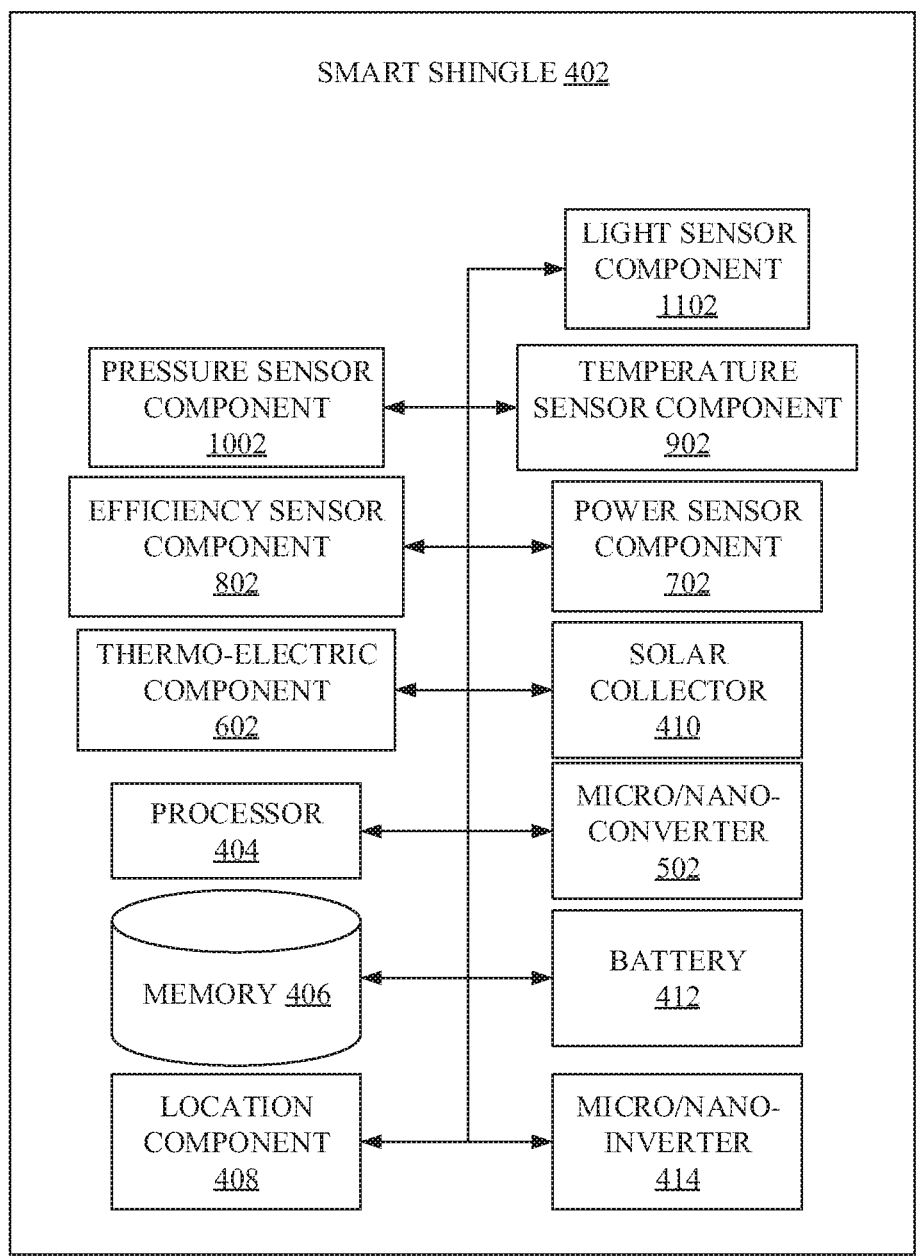
FIG. 11 illustrates a high-level functional block diagram of an example smart shingle comprising a light sensor component in accordance with various aspects disclosed herein.

Now, consider FIG. 11. FIG. 11 depicts an exemplary smart shingle system 1100 comprising at least one smart shingle in accordance with various aspects disclosed herein.

As shown, FIG. 11 illustrates nearly the same smart shingle 402 as does FIG. 10. In one embodiment, however, smart shingle 402 can comprise light sensor component 1102. Light sensor component 1102 can determine the real-time, average, and/or historic amounts of light incident on the exposed photovoltaic surface of smart shingle 402. In another embodiment, light sensor component 1102 may function as a proximity sensor which can use light and/or other electromagnetic radiation to determine the distance between an object and a surface of smart shingle 402.

By noting the instantaneous, average, and/or historical amounts of light incident on smart shingle 402 and/or the distance between smart shingle 402 and a given object, the smart shingle system can more accurately and completely monitor its performance. For example, controller 416 (or possibly smart shingle 402 itself) can leverage the information measured by light sensor component 1102 in order to determine whether and how brightly the sun is shining. This information can then be used in conjunction with data gathered by various other sensing components to help perform system diagnostics. For instance, both pressure sensor component 1002 and light sensor component 1102 may be activated, thereby indicating that something is applying pressure to the top or other surface of smart shingle 402 and that smart shingle 402 is not collecting as much light as it otherwise could. In such case, controller 416 (or possibly smart shingle 402 itself) can notify the user that a tangible object is likely resting on top of, and thereby obstructing, smart shingle 402. In another example, light sensor component 1102 may be activated while pressure sensor component 1002 is not, thereby indicating that something is blocking light that would otherwise be incident on smart shingle 402 but that that object is not physically contacting smart shingle 402. In such case, controller 416 (or possibly smart shingle 402 itself) can notify the user that shade, such as from an overhead branch, is blocking smart shingle 402. Furthermore, if light sensor component 1102 notes that light is being blocked and pressure sensor component 1002 notes that nothing is physically contacting smart shingle 402, light sensor component 1102 may determine the distance between smart shingle 402 and that which is blocking its light.

In order to measure said light, light sensor component 1102 can comprise any suitably-sized photodetector, photodiode, photoresistor, and/or any other device known in the art that can be used to sense the presence, absence, and/or magnitude of light. Moreover, in order to measure proximity, light sensor component 1102 can comprise any suitably-sized proximity sensor and/or other device which is capable of measuring distance to an obstruction by using electromagnetic radiation. The measured light values can then be stored directly in light sensor component 1102 and/or in computer-readable memory 406. Alternatively, one or more light sensors may be integrated into the smart shingle system outside of smart shingle 402 (i.e. light sensors placed in various positions on the rooftop/ground). In such case, light sensor component 1102 and/or memory 406 can leverage/receive the measured light values.

Figure 12:
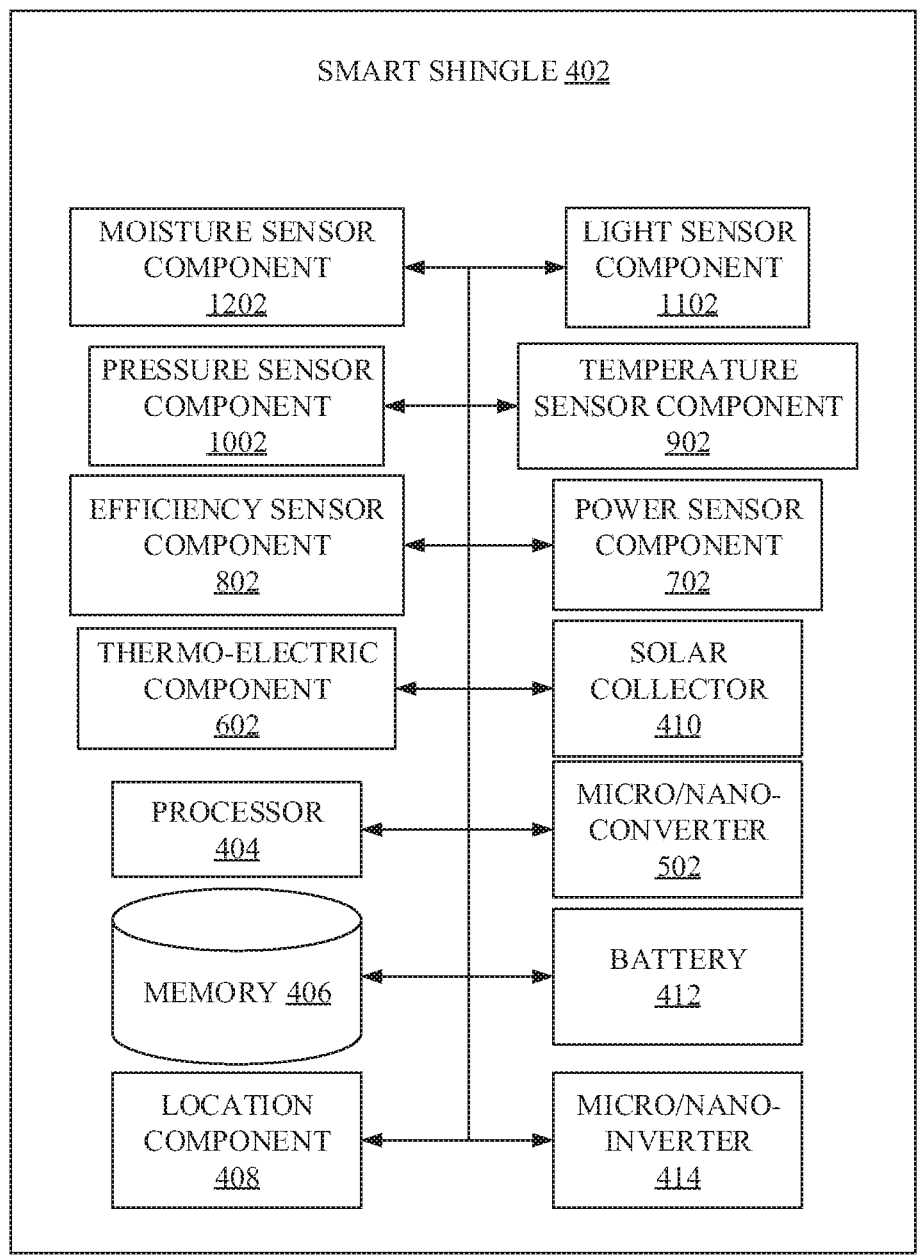
FIG. 12 illustrates a high-level functional block diagram of an example smart shingle comprising a moisture sensor component in accordance with various aspects disclosed herein.

Now, consider FIG. 12. FIG. 12 depicts an exemplary smart shingle system 1200 comprising at least one smart shingle in accordance with various aspects disclosed herein.

As shown, FIG. 12 illustrates nearly the same smart shingle 402 as does FIG. 11. In one embodiment, however, smart shingle 402 can comprise moisture sensor component 1202. Moisture sensor component 1202 can detect the presence of moisture and/or humidity within smart shingle 402. In another embodiment, moisture sensor component 1202 can detect the presence of moisture and/or humidity on the outer surfaces of smart shingle 402.

By noting the instantaneous, average, and/or historical amounts of moisture within and/or on smart shingle 402, the smart shingle system can more accurately and completely monitor its performance. For example, the smart shingle system can leverage the information measured by moisture sensor component 1202 in order to determine whether the internal electronics of smart shingle 402 are potentially compromised. For instance, moisture sensor component 1202 may indicate that moisture is detected within one or more electronics compartments of smart shingle 402. In such case, controller 416 (or possibly smart shingle 402 itself) can notify the user that smart shingle 402 has experienced a leak and therefore requires maintenance and/or repair. As another example, the smart shingle system can leverage the information measured by moisture sensor component 1202 in order to help approximate the weather. For instance, moisture sensor component 1202 may indicate that moisture is detected on the outer surfaces of smart shingle 402. In such case, the smart shingle system can notify the user that it is likely raining. In other embodiments, the information from moisture sensor component 1202 can be used in conjunction with data from various other sensors. For example, moisture sensor component 1202 may indicate that water/moisture is present on the outer surfaces of smart shingle 402 and temperature sensor component 902 can indicate that the temperature of the surface of smart shingle 402 is equal to or less than 32° F. (0° C.). In such case, controller 416 (or possibly smart shingle 402 itself) can notify the user that there is a possibility of ice forming on smart shingle 402.

In order to measure such moisture/humidity, moisture sensor component 1202 can comprise any humistor, hygrometer, dew warning sensor, soil moisture sensor, and/or any other device known in the art that can detect the presence and/or absence of moisture, humidity, and/or water. Furthermore, devices which can detect other types of liquids can also be incorporated. The information measured by moisture sensor component 1202 is then stored directly in moisture sensor component 1202 and/or computer-readable memory 406.

Figure 13:
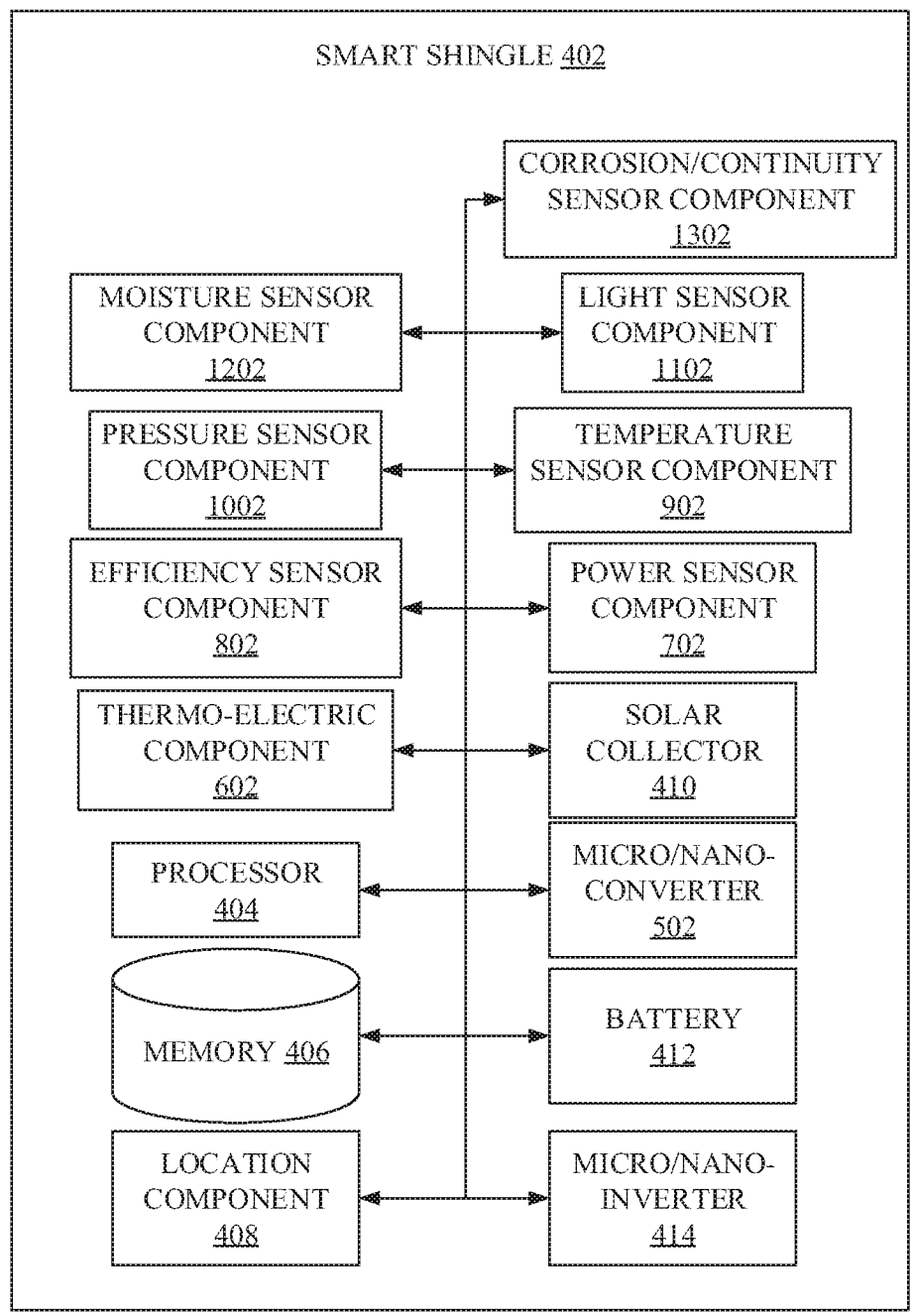
FIG. 13 illustrates a high-level functional block diagram of an example smart shingle comprising a corrosion/continuity sensor component in accordance with various aspects disclosed herein.

Now, consider FIG. 13. FIG. 13 depicts an exemplary smart shingle system 1300 comprising at least one smart shingle in accordance with various aspects disclosed herein.

As shown, FIG. 13 illustrates nearly the same smart shingle 402 as does FIG. 12. In one embodiment, however, smart shingle 402 can comprise corrosion/continuity sensor component 1302. Corrosion/continuity sensor component 1302 can determine whether the electrical connections within smart shingle 402 (as well as the electrical connections between smart shingle 402 and controller 416) are suboptimal. Corrosion/continuity sensor component 1302 does this by testing the continuity of an electrical connection (i.e. determining whether the circuit is open or closed) as well as testing the resistance of an electrical connection and comparing it with the connection's known, initial resistance or other reference value.

By noting the continuity and/or the instantaneous, average, and/or historical amounts of corrosion regarding the electrical connections within smart shingle 402 and between smart shingle 402 and controller 416, the smart shingle system can more accurately and completely monitor its performance. For example, the smart shingle system can leverage the information gathered by corrosion/continuity sensor component 1302 in order to determine whether a given electrical connection within smart shingle 402 is severed and/or no longer able to conduct the required voltage and/or current. In such case, controller 416 (or possibly smart shingle 402 itself) can notify the user that a given electrical connection inside smart shingle 402 is either cut or no longer able to perform adequately, thus requiring repair. For instance, corrosion/continuity sensor component 1302 may indicate that the electrical wire connecting location component 408 to electronic processor 404 has been severed. In such case, the smart shingle system could notify the user of the exact connection that is severed and that maintenance is required. In another instance, corrosion/continuity sensor component 1302 may indicate that the electrical wire connecting pressure sensor component 1002 to computer-readable memory 406 has been overly corroded. In such case, the smart shingle system could notify the user of the exact electrical connection that is compromised and that maintenance is recommended.

In order to measure continuity, corrosion/continuity sensor component 1302 can comprise any device known in the art that is capable of determining whether an electrical connection can be made between two given points, such as a standard continuity tester found in a multimeter. In order to measure corrosion, corrosion/continuity sensor component 1302 can comprise any voltage sensors, current sensors, resistance sensors, and/or any other devices known in the art that can determine the electrical resistance between two given points. Although continuity can be measured at any time, measuring corrosion requires that an initial and/or reference resistance be known so that any subsequent resistance measurement pertaining to a given electrical connection can be compared to the reference to determine how much the resistance has changed. Once the difference in resistance values exceeds a certain threshold (i.e. indicating excessive corrosion), the smart shingle system can notify the user of the problem and that repair is required. Once the corrosion/continuity values are measured, they can be stored in corrosion/continuity sensor component 1302 and/or computer-readable memory 406.

Figure 14:
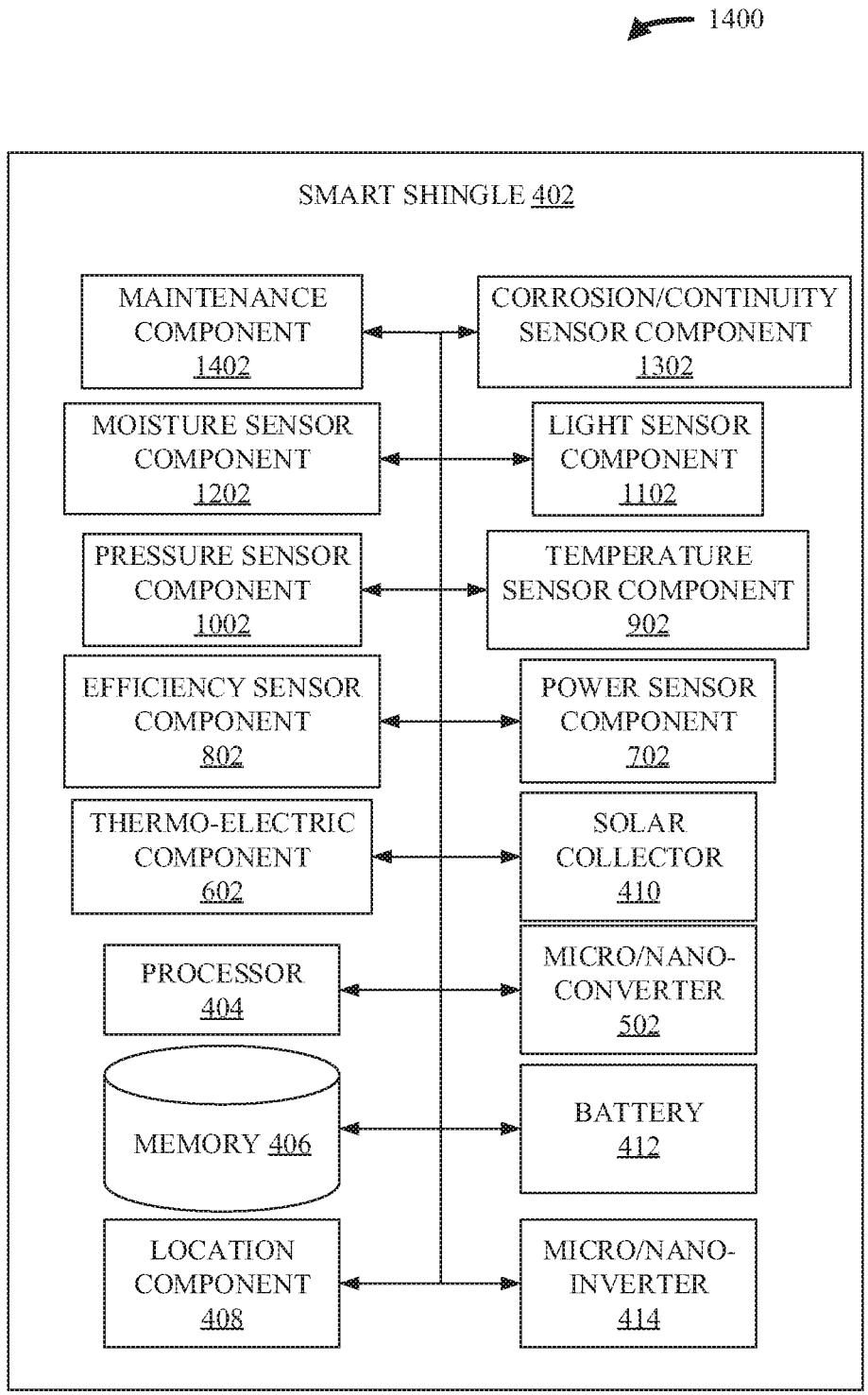
FIG. 14 illustrates a high-level functional block diagram of an example smart shingle comprising a maintenance component in accordance with various aspects disclosed herein.

Now, consider FIG. 14. FIG. 14 depicts an exemplary smart shingle system 1400 comprising at least one smart shingle in accordance with various aspects disclosed herein.

As shown, FIG. 14 illustrates nearly the same smart shingle 402 as does FIG. 13. In one embodiment, however, smart shingle 402 can comprise maintenance component 1402. Maintenance component 1402 can keep track of the various maintenance problems and/or interventions (i.e. repairs, cleanings, replacements, etc.) concerning smart shingle 402.

By keeping a record of the various maintenance problems and/or interventions concerning smart shingle 402, the smart shingle system can more accurately and more completely monitor its performance. For example, the smart shingle system may be able to leverage the information contained in maintenance component 1402 in order to determine whether smart shingle 402 is due for a cleaning, a repair, a maintenance check, etc. For instance, maintenance component 1402 may indicate that smart shingle 402 or any of its subcomponents is due for a certain periodic check-up. In such case, controller 416 (or possibly smart shingle 402 itself) can notify the user that a periodic maintenance check-up is recommended and that smart shingle 402 is due for said check-up. In another instance, maintenance component 1402 can serve as a record of all prior maintenance work that was performed on smart shingle 402, thereby ensuring that future maintenance workers are fully informed of smart shingle 402's maintenance history.

In order to record smart shingle 402's maintenance information, maintenance component 1402 can simply be manually given said information by the user and/or the user's agent. Alternatively, maintenance component 1402 can automatically update itself after maintenance is performed. In such cases, maintenance component 1402 functions as a computer-readable memory in which data can be stored and from which data can be retrieved. Any such memory known in the art can be used to construct maintenance component 1402. Alternatively, the equivalent of maintenance component 1402 can be integrated into controller 416, wherein this equivalent component keeps track of the maintenance records of all smart shingles 402 connected to controller 416.

Figure 15:
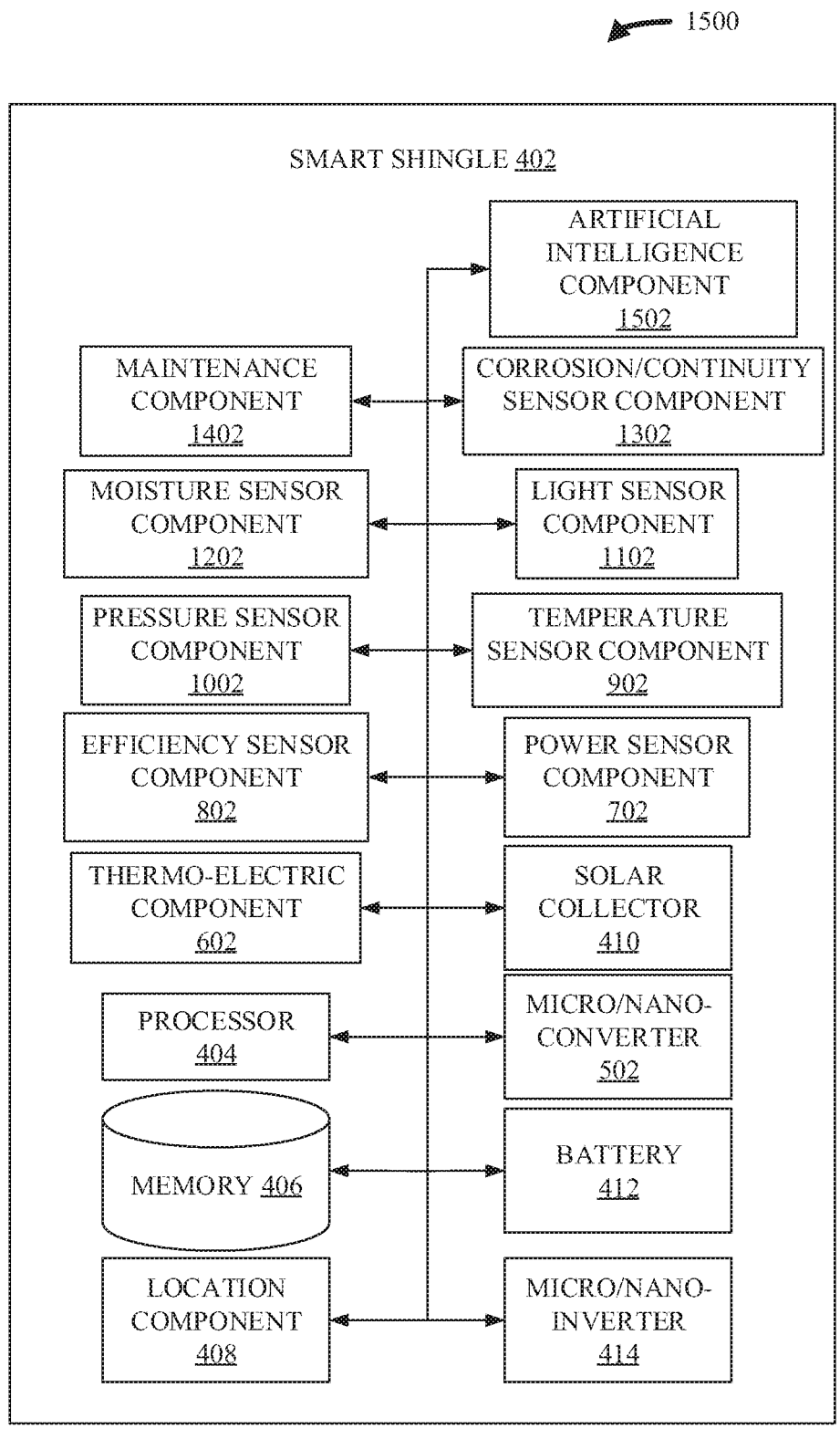
FIG. 15 illustrates a high-level functional block diagram of an example smart shingle comprising an artificial intelligence component in accordance with various aspects disclosed herein.

Now, consider FIG. 15. FIG. 15 depicts an exemplary smart shingle system 1500 comprising at least one smart shingle in accordance with various aspects disclosed herein.

As shown, FIG. 15 illustrates nearly the same smart shingle 402 as does FIG. 14. In one embodiment, however, smart shingle 402 can comprise artificial intelligence component 1502. Artificial intelligence component 1502 can employ inferential logic and/or pattern recognition to leverage any data gathered by the various sensory components of smart shingle 402 in order to automatically diagnose problems with smart shingle 402 and/or to generate recommended solutions for said problems. For example, artificial intelligence component 1502 can leverage information collected by pressure sensor component 1002 and light sensor component 1102 in order to determine whether an obstruction is an object resting on the surface of smart shingle 402 or if the obstruction is simply shade from an overhanging object. Artificial intelligence component 1502 can then generate a solution to the identified problem, such as recommending that the user clear the object if it is contacting smart shingle 402 or that the user otherwise ensure that smart shingle 402 has an unobstructed view of the sky (i.e. by trimming overhanging tree branches, etc.). The smart shingle system can then notify the user accordingly. As another example, artificial intelligence component 1502 can leverage information from pressure sensor component 1002, temperature sensor component 902, and moisture sensor component 1202 in order to detect that something relatively heavy, cold, and wet is setting on top of smart shingle 402. In such case, artificial intelligence component 1502 can infer that snow and/or ice has accumulated on smart shingle 402. The smart shingle system can then notify the user of the problem and recommend that the snow/ice be cleared. Alternatively, or possibly concurrently, controller 416 can be integrated with an artificial intelligence component, as described below in connection with FIG. 24. In either embodiment, the following description of artificial intelligence applies.

The embodiments of the present invention herein can employ artificial intelligence (AI) to facilitate automating one or more features of the present invention. The components can employ various AI-based schemes for carrying out various embodiments/examples disclosed herein. In order to provide for or aid in the numerous determinations (e.g., determine, ascertain, infer, calculate, predict, prognose, estimate, derive, forecast, detect, compute) of the present invention, components of the present invention can examine the entirety or a subset of the data to which it is granted access and can provide for reasoning about or determine states of the system, environment, etc. from a set of observations as captured via events and/or data. Determinations can be employed to identify a specific context or action, or can generate a probability distribution over states, for example. The determinations can be probabilistic; that is, the computation of a probability distribution over states of interest based on a consideration of data and events. Determinations can also refer to techniques employed for composing higher-level events from a set of events and/or data.

Such determinations can result in the construction of new events or actions from a set of observed events and/or stored event data, whether or not the events are correlated in close temporal proximity, and whether the events and data come from one or several event and data sources. Components disclosed herein can employ various classification (explicitly trained (i.e. via training data) as well as implicitly trained (i.e. via observing behavior, preferences, historical information, receiving extrinsic information, etc.)) schemes and/or systems (i.e. support vector machines, neural networks, expert systems, Bayesian belief networks, fuzzy logic, data fusion engines, etc.) in connection with performing automatic and/or determined action in connection with the claimed subject matter. Thus, classification schemes and/or systems can be used to automatically learn and perform a number of functions, actions, and/or determinations.

A classifier can map an input attribute vector, $z=(z1, z2, z3, z4, zn)$, to a confidence that the input belongs to a class, as by $f(z)=confidence(class)$. Such classification can employ a probabilistic and/or statistical-based analysis (i.e. factoring into the analysis utilities and costs) to determinate an action to be automatically performed. A support vector machine (SVM) can be an example of a classifier that can be employed. The SVM operates by finding a hyper-surface in the space of possible inputs, where the hyper-surface attempts to split the triggering criteria from the non-triggering events. Intuitively, this makes the classification correct for testing data that is near, but not identical to training data. Other directed and undirected model classification approaches include, i.e. naïve Bayes, Bayesian networks, decision trees, neural networks, fuzzy logic models, and/or probabilistic classification models providing different patterns of independence can be employed. Classification as used herein also is inclusive of statistical regression that is utilized to develop models of priority.

Figure 16:
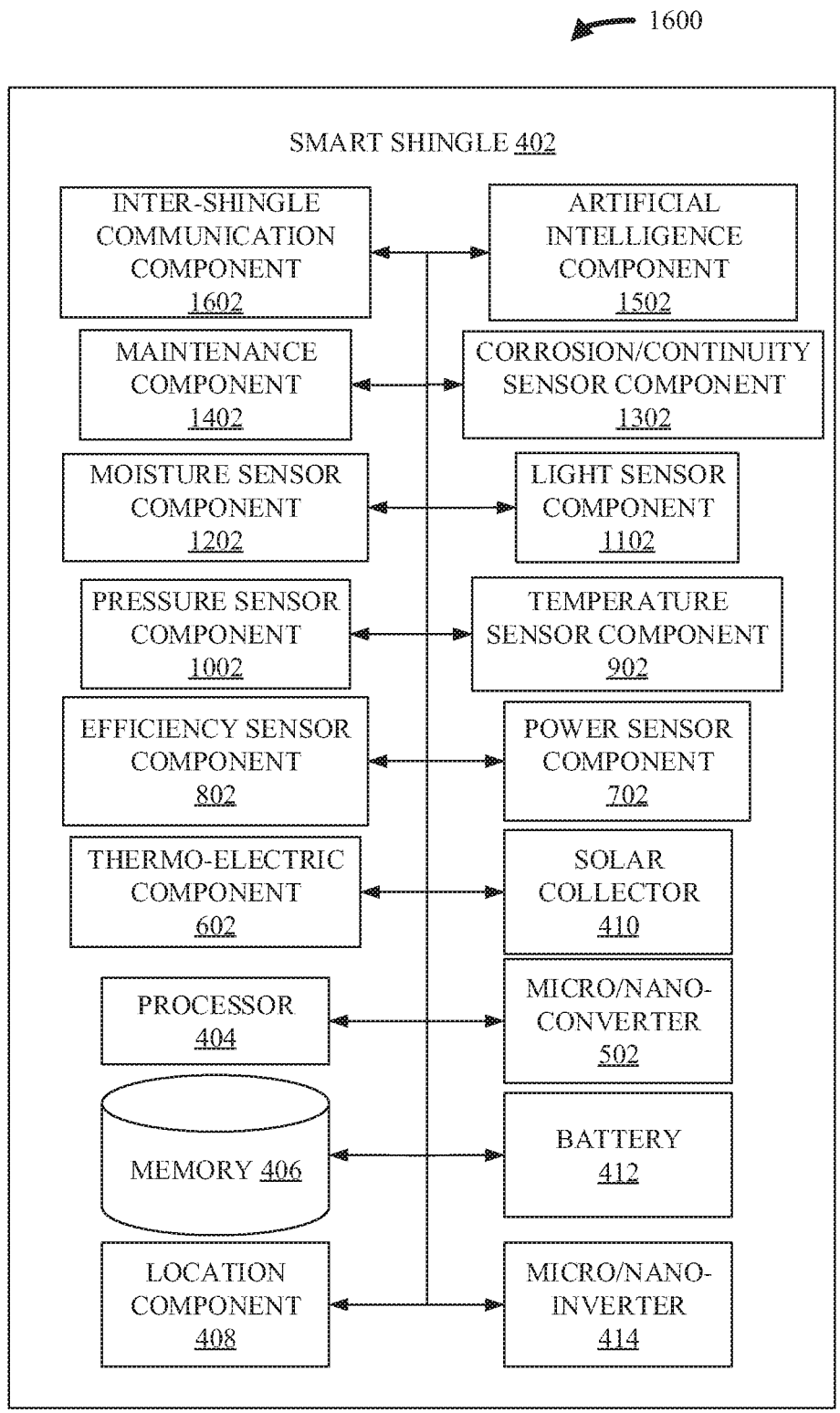
FIG. 16 illustrates a high-level functional block diagram of an example smart shingle comprising an inter-shingle communication component in accordance with various aspects disclosed herein.

Now, consider FIG. 16. FIG. 16 depicts an exemplary smart shingle system 1600 comprising at least one smart shingle in accordance with various aspects disclosed herein.

As shown, FIG. 16 illustrates nearly the same smart shingle 402 as does FIG. 15. In one embodiment, however, smart shingle 402 can comprise inter-shingle communication component 1602. Inter-shingle communication component 1602 can enable smart shingle 402 to communicate and/or otherwise interact with other smart shingles in the smart shingle system.

By facilitating inter-shingle communication, the smart shingle system can more accurately and more completely monitor its performance. For example, the smart shingle system can use inter-shingle communication component 1602 in order to leverage the data measured by the various sensory components of other smart shingles. In this way, smart shingle 402 has access to its own measured data as well as the measured data of other smart shingles in the smart shingle system. This could allow artificial intelligence component 1502 to make more informed determinations and recommendations. For instance, smart shingle 402 can retrieve the shingle address of any and/or all other smart shingles in the smart shingle system, thus allowing smart shingle 402 to know its location on the rooftop relative to other smart shingles. Smart shingle 402 then knows which smart shingles are its neighbors and can then compare its sensory data with its neighbors' sensory data in order to perform system diagnostics. As an example, if smart shingle 402 senses reduced incident light and power output, it can check the measured light and power outputs of its neighboring shingles in order to determine whether the obstruction is large or small.

In order to facilitate such communication, inter-shingle communication component 1602 can comprise any means of electronic communication, either wired or wireless, that would allow smart shingle 402 to communicate and share data with other smart shingles in the system. In one embodiment, inter-shingle communication component 1602 can comprise the same devices/methods as wireless or wired data connection 420.

Figure 17:
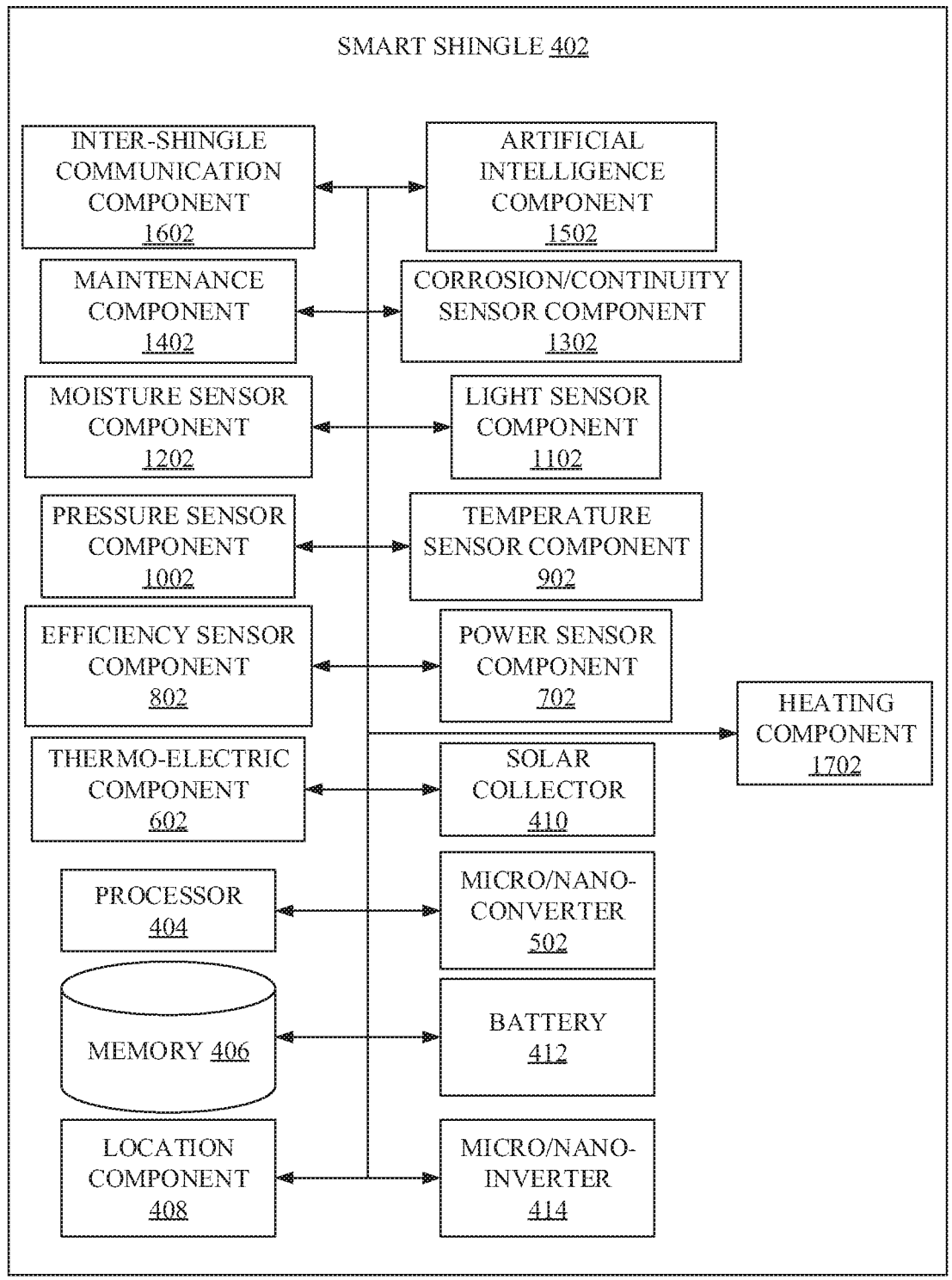
FIG. 17 illustrates a high-level functional block diagram of an example smart shingle comprising a heating component in accordance with various aspects disclosed herein.

Now, consider FIG. 17. FIG. 17 depicts an exemplary smart shingle system 1700 comprising at least one smart shingle in accordance with various aspects disclosed herein.

As shown, FIG. 17 illustrates nearly the same smart shingle 402 as does FIG. 16. In one embodiment, however, smart shingle 402 can comprise heating component 1702. Heating component 1702 can use electric power to generate heat (either automatically or at the user's instruction) so as to melt snow and/or ice that has accumulated on smart shingle 402. This electric power can be received either from solar collector 410, battery 412 (if present), converter 502 (if present), and/or other electrical grid 422.

By melting away snow and/or ice accumulation, the smart shingle system is able to help keep itself clear of debris in the winter and can also help prevent damage to the building that is caused by ice dams and/or heavy snow loads. Furthermore, automated snow/ice removal benefits the user by obviating the need for manual snow/ice removal. In such case, the user saves his/her time and effort and need not expose himself/herself to the dangers of climbing an icy roof in the winter.

In order to melt away snow and/or ice, heating component 1702 can comprise any suitably-sized heating cable, heating panel, and/or any other roof deicing device known in the art. Alternatively, a centralized heating system (i.e. a mesh of heating cables spanning the entire smart shingle system, or the like) can be integrated into the smart shingle system outside of smart shingle 402 and can be controlled by controller 416. In either case, the smart shingle system is at least able to help keep snow and/or ice build-up at bay during the winter. As mentioned above, heating component 1702 can be powered by solar collector 410, battery 412 (if present), converter 502 (if present), and/or electrical grid 422. Alternatively, heating component 1702 may comprise its own power source.

Figure 18:
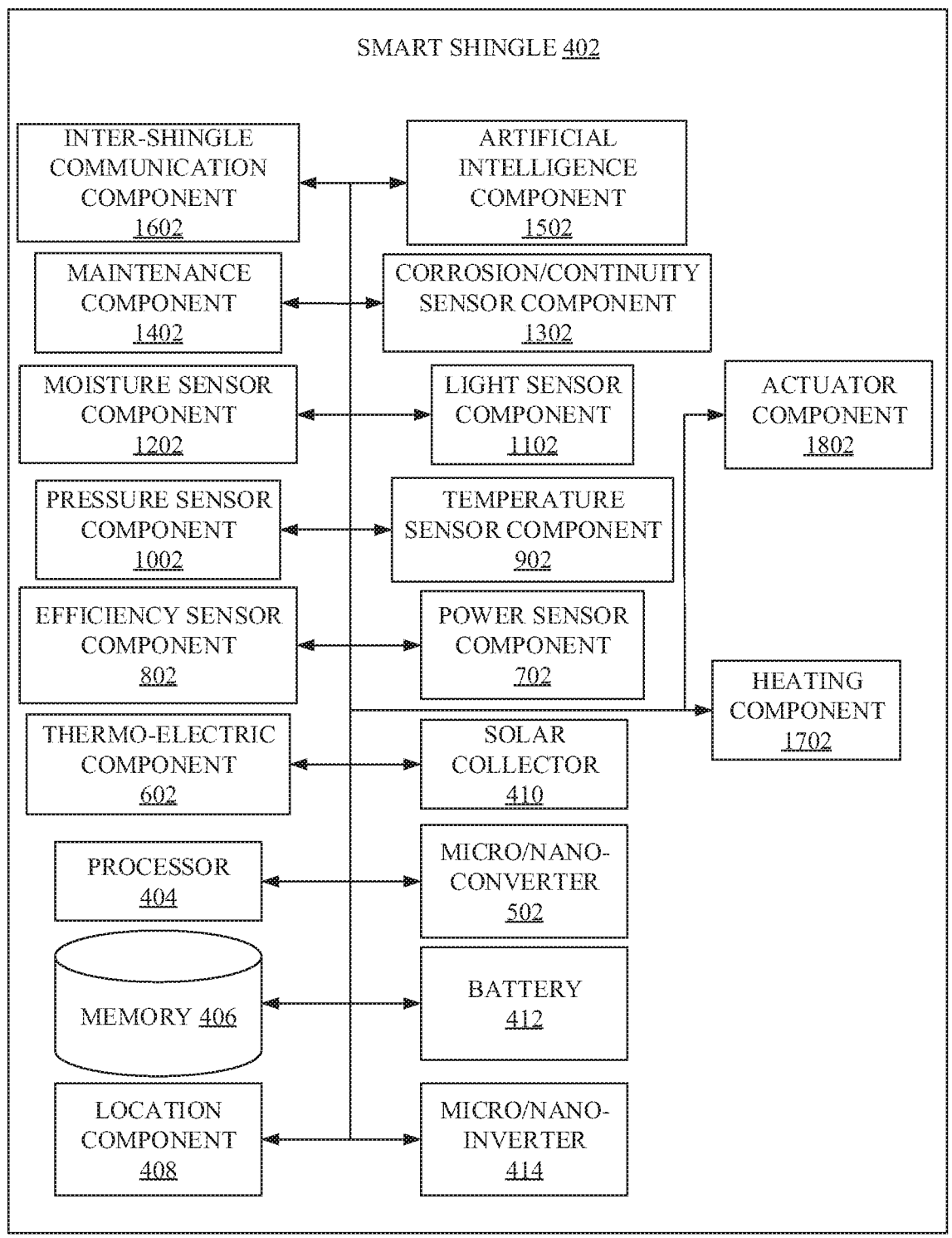
FIG. 18 illustrates a high-level functional block diagram of an example smart shingle comprising an actuator component in accordance with various aspects disclosed herein.

Now, consider FIG. 18. FIG. 18 depicts an exemplary smart shingle system 1800 comprising at least one smart shingle in accordance with various aspects disclosed herein.

As shown, FIG. 18 illustrates nearly the same smart shingle 402 as does FIG. 17. In one embodiment, however, smart shingle 402 can comprise actuator component 1802. Actuator component 1802 can help keep smart shingle 402 clear of debris (either automatically or at the user's instruction), such as leaves, tree branches, etc. Actuator component 1802 can accomplish this through the use of one or more mechanical arms powered by electric (or other) motors/actuators and/or through the use of air and/or water pumps that can blow/force away debris. For example, each smart shingle 402 can comprise its own set of suitably-sized mechanical wipers and/or air/water pumps to help keep the exposed surface of solar collector 410 clear of debris. In another embodiment, a centralized actuator component (i.e. wipers, other mechanical devices, and/or air/water pumps that can collectively span the entire smart shingle system, and the like) can be integrated into the smart shingle system outside of smart shingle 402. For example, the rooftop may be outfitted with one or more large wipers and/or air/water pumps that collectively help to keep the entire smart shingle system clear of debris. In such case, the centralized actuator component could be controlled by controller 416.

Alternatively, or possibly concurrently, actuator component 1802 can comprise one or more servo motors (or other rotational and/or linear actuators) that enable smart shingle 402 to change the angle of incidence between itself and any sunlight it is receiving. In this way, each smart shingle 402 could determine its own optimal orientation on the rooftop using light sensor component 1102 and then assume that orientation via actuator component 1802. Note, however, that this particular embodiment may conflict with the goal of protecting the building from inclement weather. After all, movable shingles may provide less water and/or weather protection to the building.

As with heating component 1702, actuator component 1802 can receive electric power from solar collector 410, battery 412 (if present), converter 502 (if present), electrical grid 422, and/or its own power source.

Figure 19:
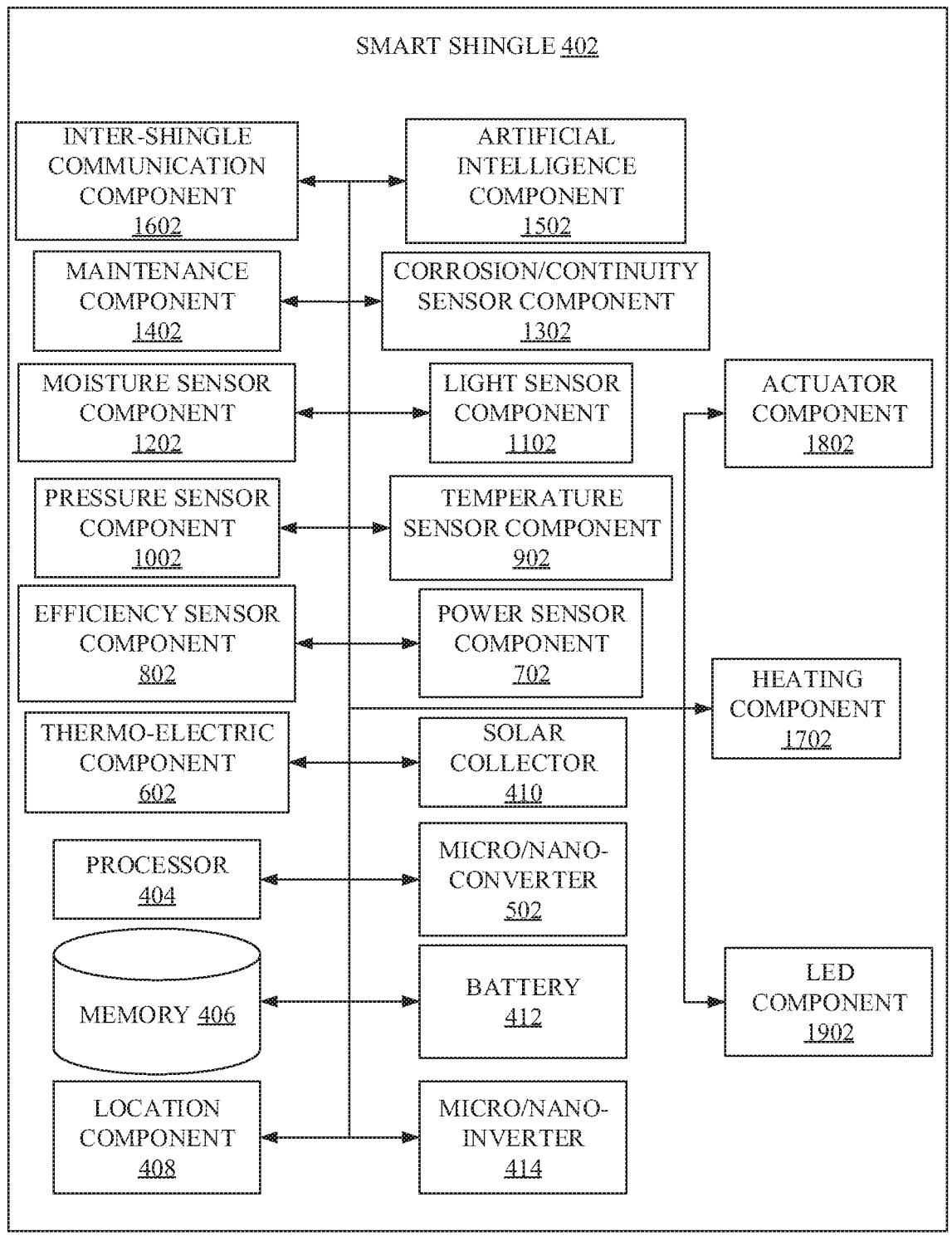
FIG. 19 illustrates a high-level functional block diagram of an example smart shingle comprising an LED component in accordance with various aspects disclosed herein.

Finally, consider FIG. 19. FIG. 19 depicts an exemplary smart shingle system 1900 comprising at least one smart shingle in accordance with various aspects disclosed herein.

As shown, FIG. 19 illustrates nearly the same smart shingle 402 as does FIG. 18. In one embodiment, however, smart shingle 402 can comprise LED (light-emitting diode) component 1902. LED component 1902 can allow smart shingle 402 (or possibly controller 416) to display one or more visual lights, signals, and/or messages on the surfaces of smart shingle 402. These visual signals may serve any purpose, such as optical warnings to the user that a certain sensor has been activated. For example, the lights displayed by smart shingle 402 may vary by color, wherein each color represents the activation of a different subcomponent. Alternatively, or possibly concurrently, the lights shown may spell out words, messages, pictures, advertisements, etc.

In order to produce such lights, LED component 1902 can comprise any suitably-sized group of light-emitting diodes and/or any other device known in the art that can produce such light signals. As with actuator component 1802, LED component 1902 can receive electric power from solar collector 410, battery 412 (if present), converter 502 (if present), electrical grid 422, and/or its own power source.

The preceding several paragraphs and figures pertain to smart shingle 402. As explained above, one of ordinary skill in the art will appreciate that the subject claimed invention may be practiced using nearly any combination/permutation of the aforementioned components. With that in mind, attention is invited to controller 416.

Figure 20:
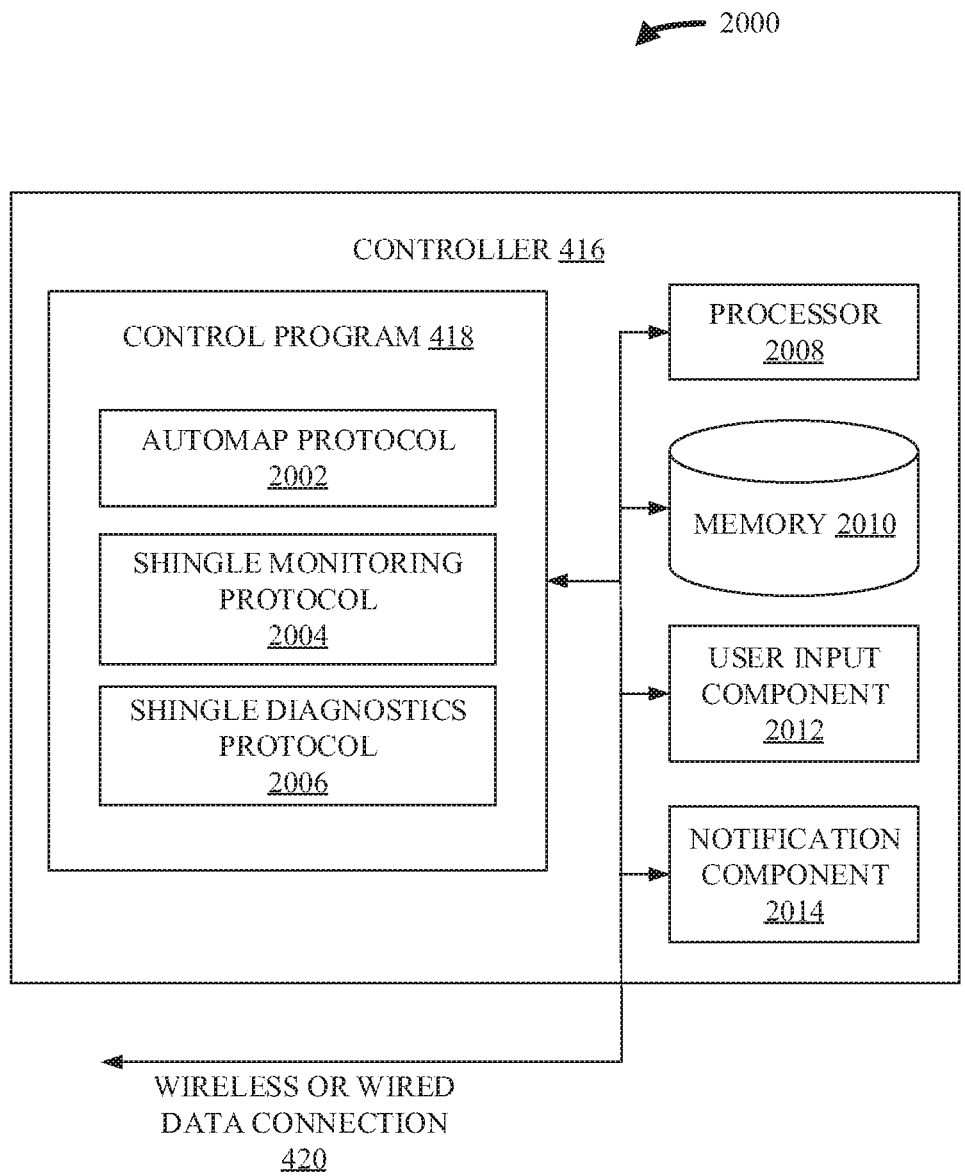
FIG. 20 illustrates a high-level functional block diagram of an example smart shingle controller comprising various subcomponents in accordance with various aspects disclosed herein.

FIG. 20 depicts an exemplary smart shingle controller comprising various subcomponents in accordance with various aspects disclosed herein. As shown, controller 416 comprises electronic processor 2008 and computer-readable memory 2010, which are similar to processor 404 and memory 406 explained above. Controller 416 also comprises control program 418, which contains one or more protocols to be executed and performed by controller 416. In one embodiment, control program 418 can comprise automap protocol 2002, which can instruct controller 416 to leverage the shingle address 424 of each smart shingle 402 in the smart shingle system in order to automatically determine which smart shingles are neighbors. As explained thoroughly above, such automap information can be used to help perform system diagnostics. In another embodiment, control program 418 can comprise shingle monitoring protocol 2004, which can instruct controller 416 to receive (periodically, continuously, and/or otherwise) the data collected by each smart shingle 402 via each smart shingle 402's various sensory components. In yet another embodiment, control program 418 can comprise shingle diagnostics protocol 2006, which can instruct controller 416 to analyze the data collected according to shingle monitoring protocol 2004 in order to diagnose likely problems pertaining to the smart shingle system as well as to determine recommended solutions. This could be executed by an artificial intelligence component.

As shown, controller 416 can also comprise user input component 2012 in order to allow the user to interact with the smart shingle system. As explained above, user input component 2012 may comprise any suitable interface method/device, such as one or more computer screens with one or more keyboards/keypads, one or more touchscreens, etc. Furthermore, user interface component 2012 may comprise a wireless communication device which could allow a user to remotely interface with controller 416 via a phone, laptop, desktop computer, and/or other device.

Finally, controller 416 may comprise notification component 2014, which can allow controller 416 to notify a user of any data collected by the smart shingles, any problems diagnosed by the controller, and/or any recommended solutions. As explained above, notification component 2014 can comprise any method/device known in the art which can facilitate visual, audible, and/or vibratory messages/signals/notifications communicated via a hardwired connection and/or wirelessly.

Figure 21:
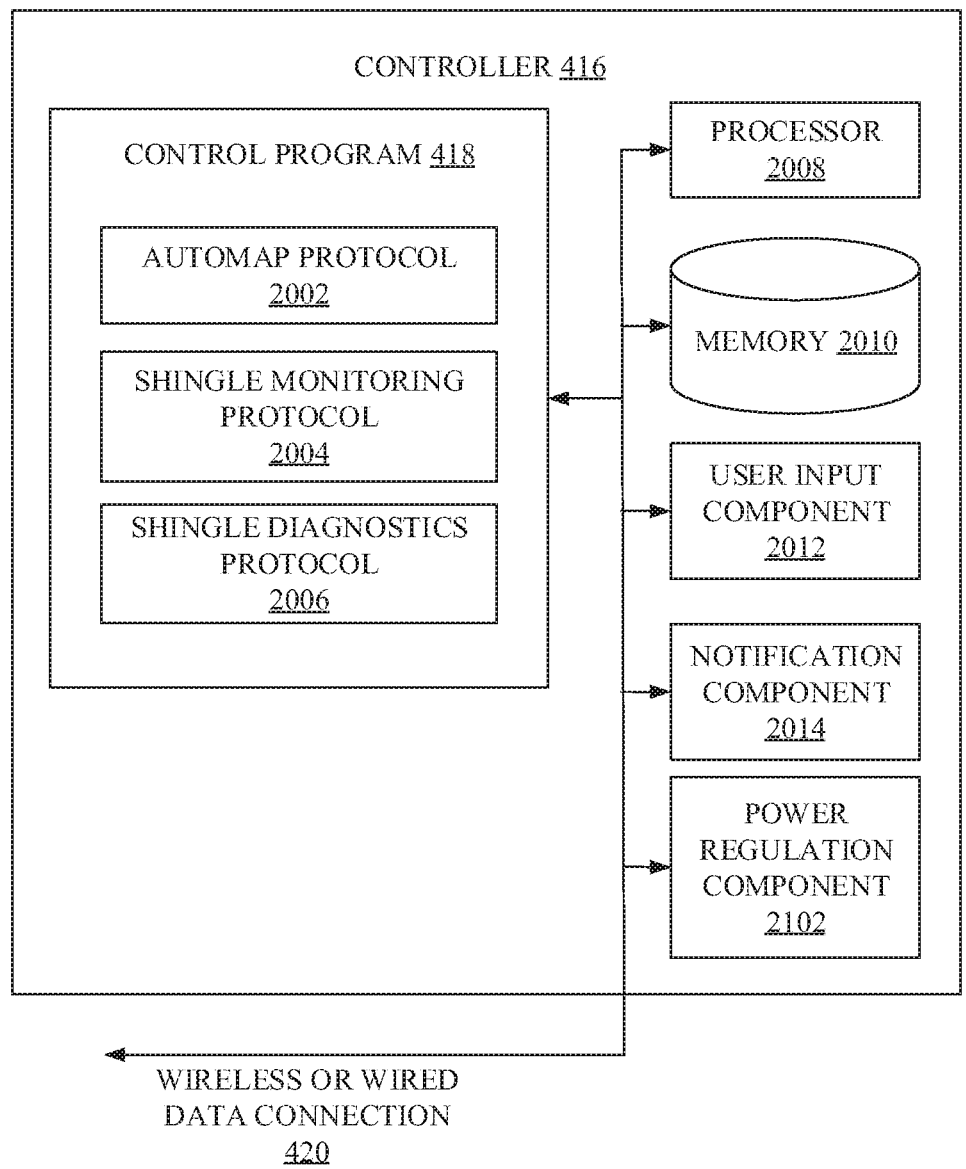
FIG. 21 illustrates a high-level functional block diagram of an example smart shingle controller comprising a power regulation component in accordance with various aspects disclosed herein.

Now, consider FIG. 21. FIG. 21 depicts an exemplary smart shingle controller comprising a power regulation component in accordance with various aspects disclosed herein.

As shown, FIG. 21 illustrates nearly the same controller 416 as does FIG. 20. In one embodiment, however, controller 416 can comprise power regulation component 2102. Power regulation component 2102 allows controller 416 to control the amount of electricity flowing to and/or from each smart shingle 402. In this way, controller 416 can influence which subcomponents of each smart shingle 402 are activated. For example, if smart shingle 402 determines that snow and/or ice has accumulated on its surface, it can inform controller 416, which can then utilize power regulation component 2102 to supply electricity to heating component 1702. Similarly, if smart shingle 402 determines that leaves have accumulated on its surface, it can inform controller 416, which can then utilize power regulation component 2102 to supply electricity to actuator component 1802. In another embodiment, power regulation component 2102 can be used to supply electricity to smart shingle 402 so as to charge battery 412, such as when battery 412 is nearly depleted and the sun is not shining.

In order to accomplish such power regulation, power regulation component 2102 can comprise any set of transistors, electronic switches, and/or other devices known in the art that can increase/decrease the flow of electricity in a given electrical connection.

Figure 22:
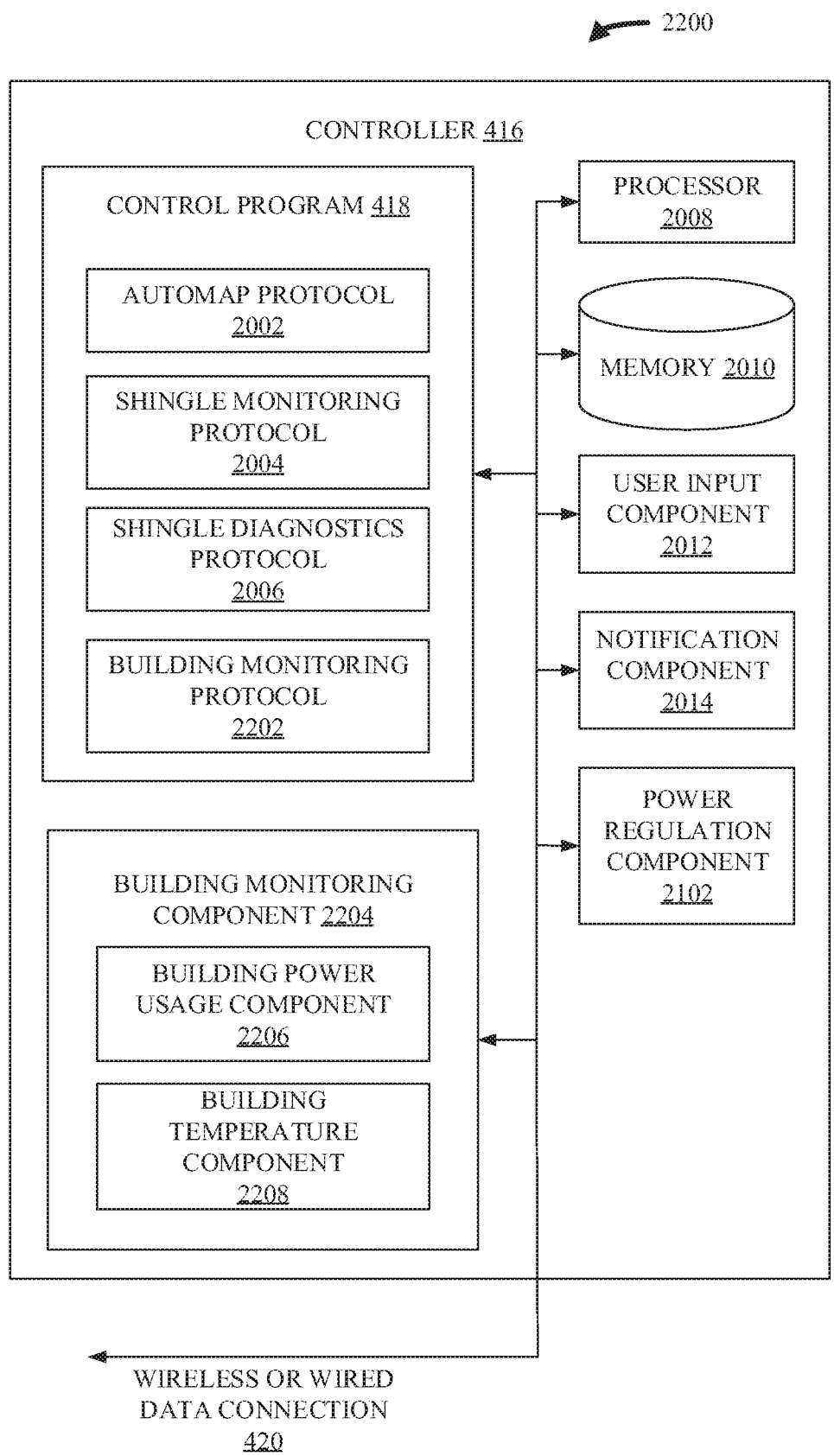
FIG. 22 illustrates a high-level functional block diagram of an example smart shingle controller comprising a building monitoring component and protocol in accordance with various aspects disclosed herein.

Now, consider FIG. 22. FIG. 22 depicts an exemplary smart shingle controller in accordance with various aspects disclosed herein.

As shown, FIG. 22 depicts nearly the same controller 416 as does FIG. 21. In one embodiment, however, controller 416 can comprise building monitoring protocol 2202 and corresponding building monitoring component 2204. Building monitoring protocol 2202 can instruct controller 416 to monitor the electricity usage of the building. Controller 416 can then leverage this information in order to help optimize the power generation of the smart shingle system. For example, controller 416 can track the electricity usage in the building according to building monitoring protocol 2202. If power usage is low in the building and power generation by the smart shingle system is high, controller 416 can instruct each smart shingle 402 to use the electricity that it is producing to charge battery 412 (if present). Once smart shingle 402 notifies controller 416 that battery 412 is fully charged, controller 416 can then instruct smart shingle 402 to channel the electricity that it is producing to electrical grid 422.

Building monitoring component 2204 enables controller 416 to monitor the building's power usage. To accomplish this, building monitoring component 2204 can comprise building power usage component 2206, which can measure the amount of electricity being consumed by the building in real-time. Building power usage component 2206 can also note the average and/or historical power usage of the building. These values can then be stored in memory 2010 and/or building monitoring component 2204. In order to perform these functions, building monitoring component 2206 can comprise any devices comprised by power sensor component 702 explained above.

Building monitoring component 2204 can also comprise building temperature component 2208, which can measure temperature differentials throughout the building. Controller 416 can leverage such information so as to optimize power generation by smart shingle 402 via thermo-electric component 602. Building temperature component 2208 can comprise any device comprised by temperature sensor component 902 explained above.

Figure 23:
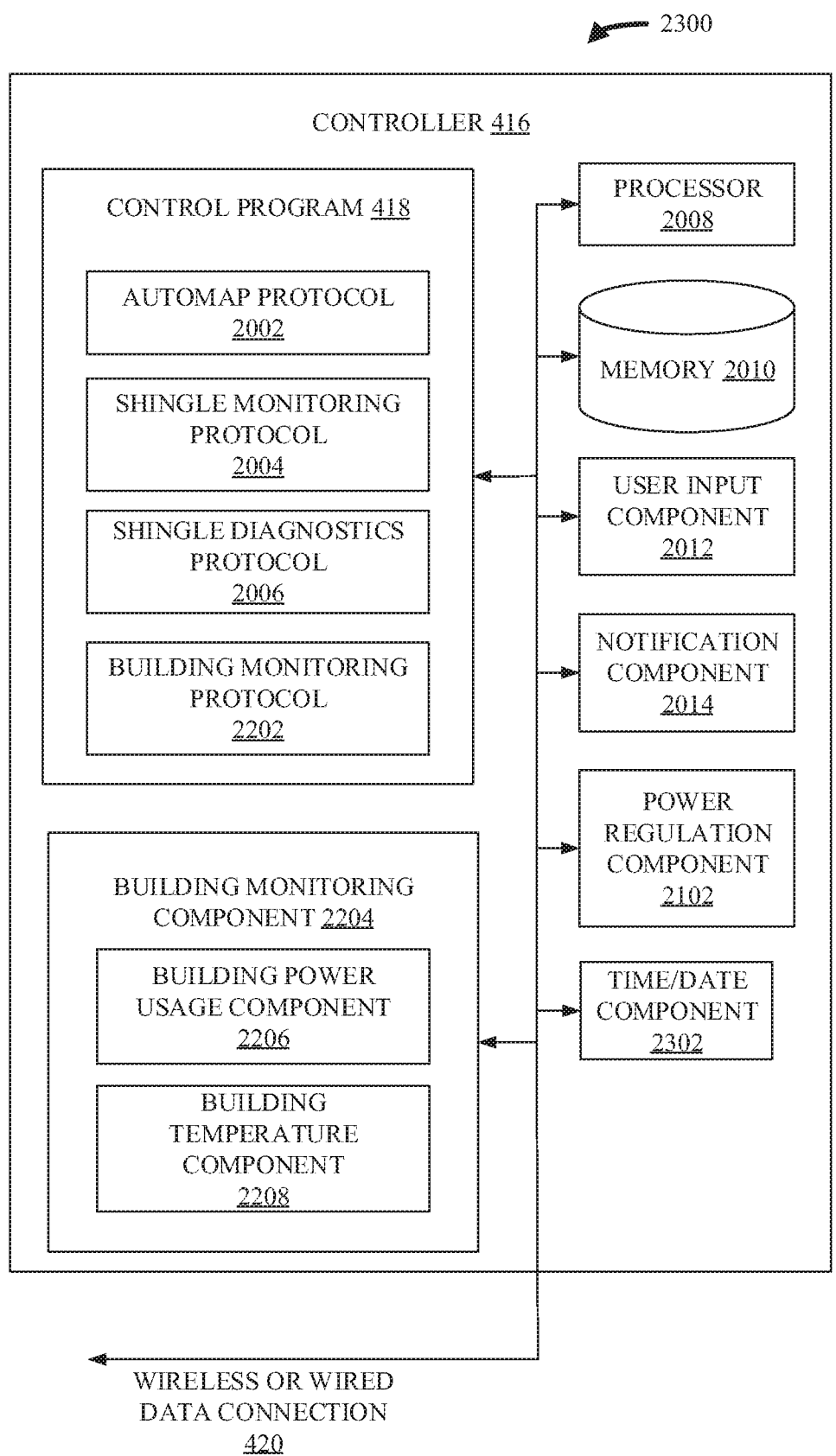
FIG. 23 illustrates a high-level functional block diagram of an example smart shingle controller comprising a time/date component in accordance with various aspects disclosed herein.

Now, consider FIG. 23. FIG. 23 depicts an exemplary smart shingle controller in accordance with various aspects disclosed herein.

As shown, FIG. 23 illustrates nearly the same controller 416 as does FIG. 22. In one embodiment, however, controller 416 can comprise time/date component 2302. Time/date component 2302 can keep track of the time of day and/or the time of year. This information can then be leveraged by controller 416 (as well as by each smart shingle 402) to optimize power generation and/or usage of the smart shingle system. For example, many electricity providers offer price discounts for electricity usage during non-peak hours. By keeping track of the time of day, controller 416 can instruct each smart shingle 402 to utilize its own battery 412 if needed during peak hours (i.e. daylight hours). During the night (which is a non-peak time), however, controller 416 can use power regulation component 2102 to charge any battery 412 that needs charged. In such case, the user saves money by using electricity from electrical grid 422 when it is least expensive. In another embodiment, time/date component 2302 can perform the same cost-saving function with regard to the time of year since electricity providers may raise prices in the summer due to increased demand. Furthermore, the information regarding time of year can be leveraged by controller 416 and/or each smart shingle 402 to determine and/or validate their approximations regarding the weather.

In order to accomplish this, time/date component 2302 can comprise any clock and/or other electronic timing device known in the art.

Figure 24:
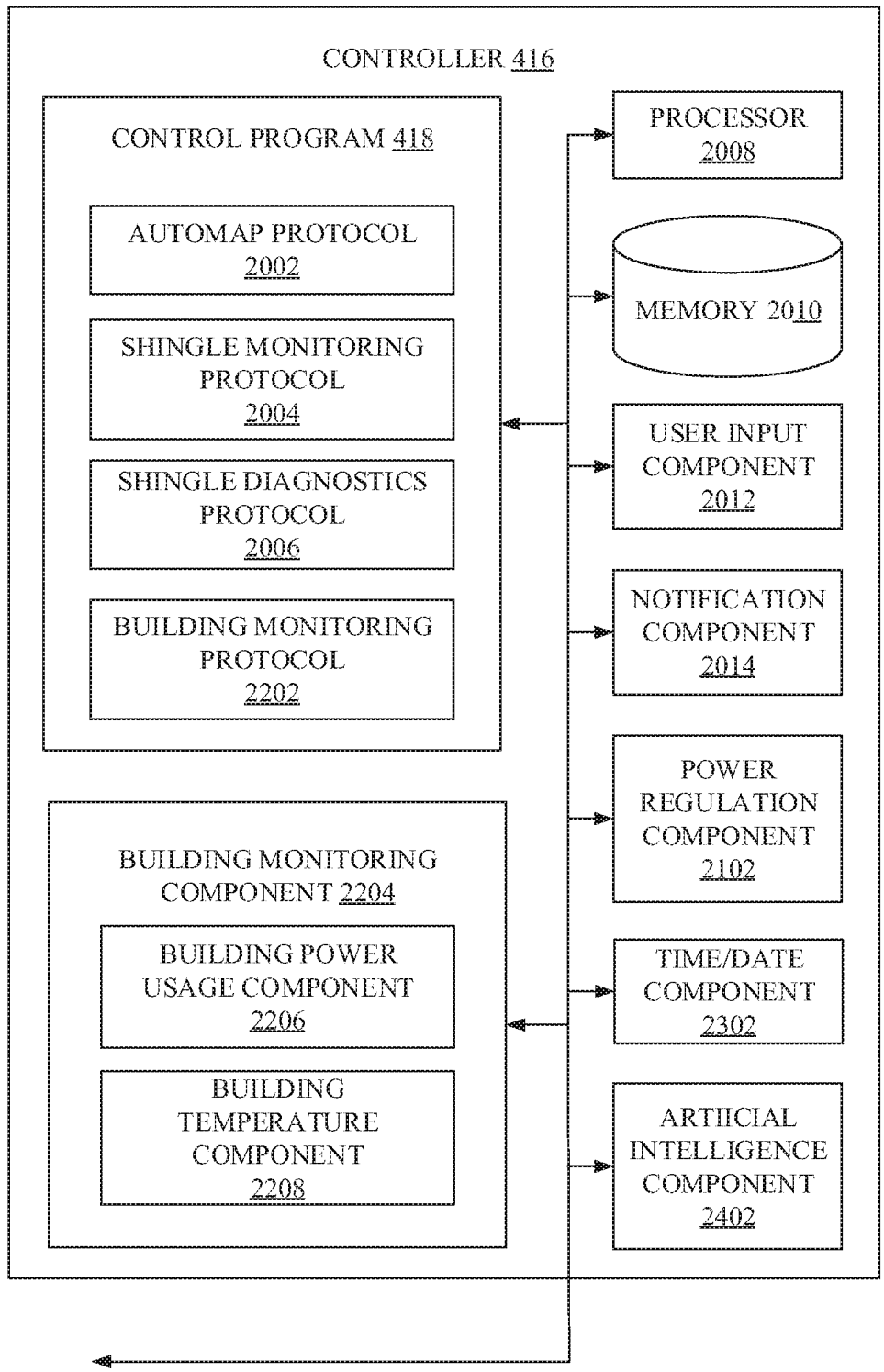
FIG. 24 illustrates a high-level functional block diagram of an example smart shingle controller comprising an artificial intelligence component in accordance with various aspects disclosed herein.

Now, consider FIG. 24. FIG. 24 depicts an exemplary smart shingle controller in accordance with various aspects disclosed herein.

As shown, FIG. 24 illustrates nearly the same controller 416 as does FIG. 23. In one embodiment, however, controller 416 can comprise artificial intelligence component 2402. Artificial intelligence component 2402 can utilize inferential logic and/or pattern recognition to analyze data collected by each smart shingle's various sensory components as well as building monitoring component 2204 in order to help perform system diagnostics. Since artificial intelligence component 2402 functions just like artificial intelligence component 1502, the above discussion of artificial intelligence in paragraphs 00134-00136 applies here.

Figure 25:
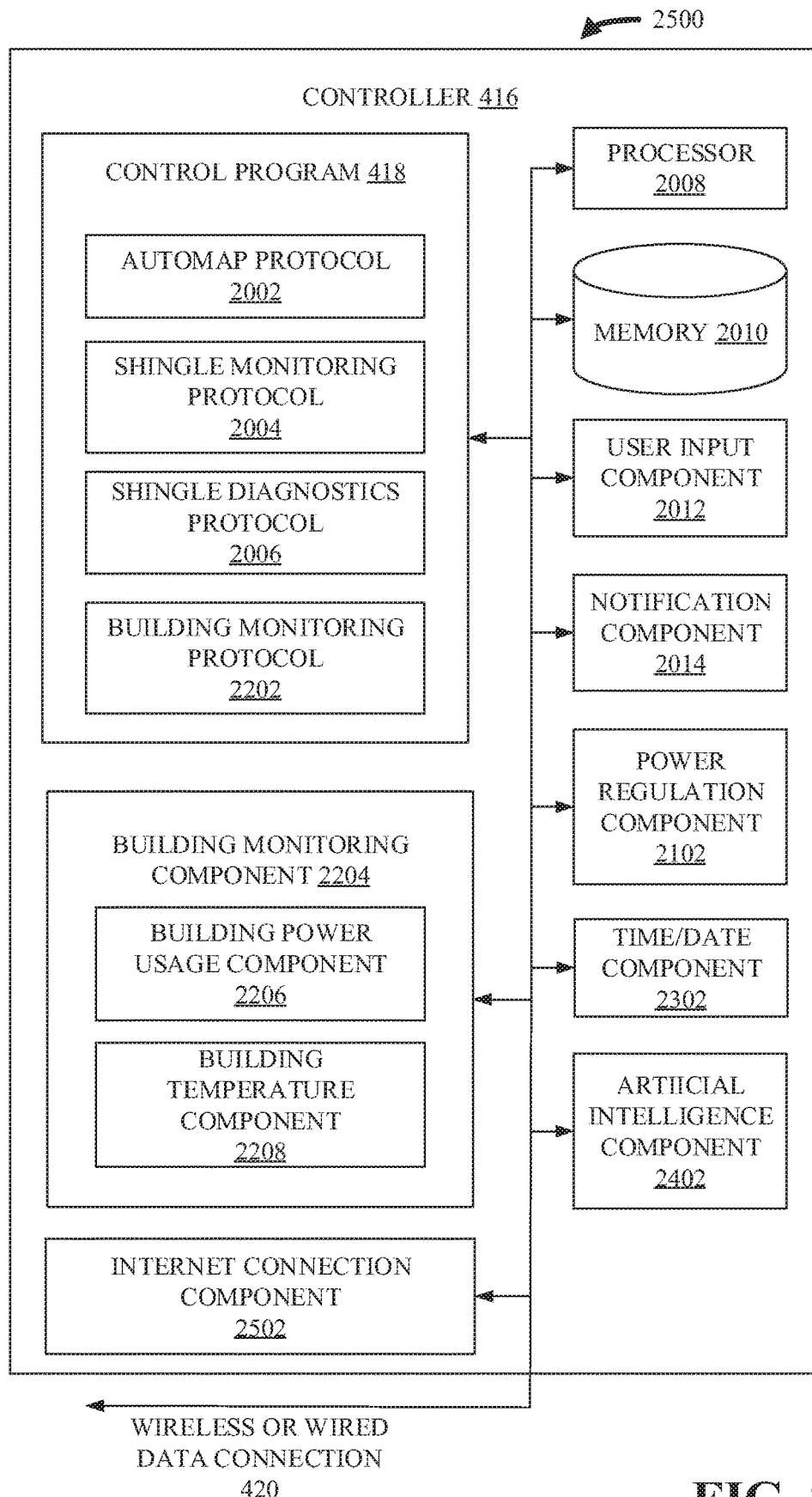
FIG. 25 illustrates a high-level functional block diagram of an example smart shingle controller comprising an internet communication component in accordance with various aspects disclosed herein.

Now, consider FIG. 25. FIG. 25 depicts an exemplary smart shingle controller in accordance with various aspects disclosed herein.

As shown, FIG. 25 illustrates nearly the same controller 416 as does FIG. 24. In one embodiment, however, controller 416 can comprise internet connection component 2502. Internet connection component 2502 can comprise any wired and/or wireless method/device known in the art that can facilitate access to the internet. Controller 416 can use internet connection component 2502 to obtain data regarding local electricity prices as well as local weather forecasts. Controller 416 can then leverage this information, possibly using artificial intelligence component 2402, in order to perform system diagnostics. For example, the local weather forecast can be obtained via internet connection component 2502 and then be used in conjunction with temperature sensor component 902, pressure sensor component 1002, light sensor component 1102, and/or moisture sensor component 1202 in order to verify that snow and/or ice (or any other debris) has accumulated on the rooftop. Furthermore, local weather forecasts can be leveraged by artificial intelligence component 2402 to create power generation plans. For instance, if the batteries of the smart shingle system are nearly depleted and the local weather forecast indicates that a storm is approaching, controller 416 can determine that it would be best to charge the batteries now using electricity from the grid and/or any electricity generated by the smart shingles rather than to forestall the charging and risk completely depleting the batteries in a time period during which solar power generation will be severely limited.

Figure 26:
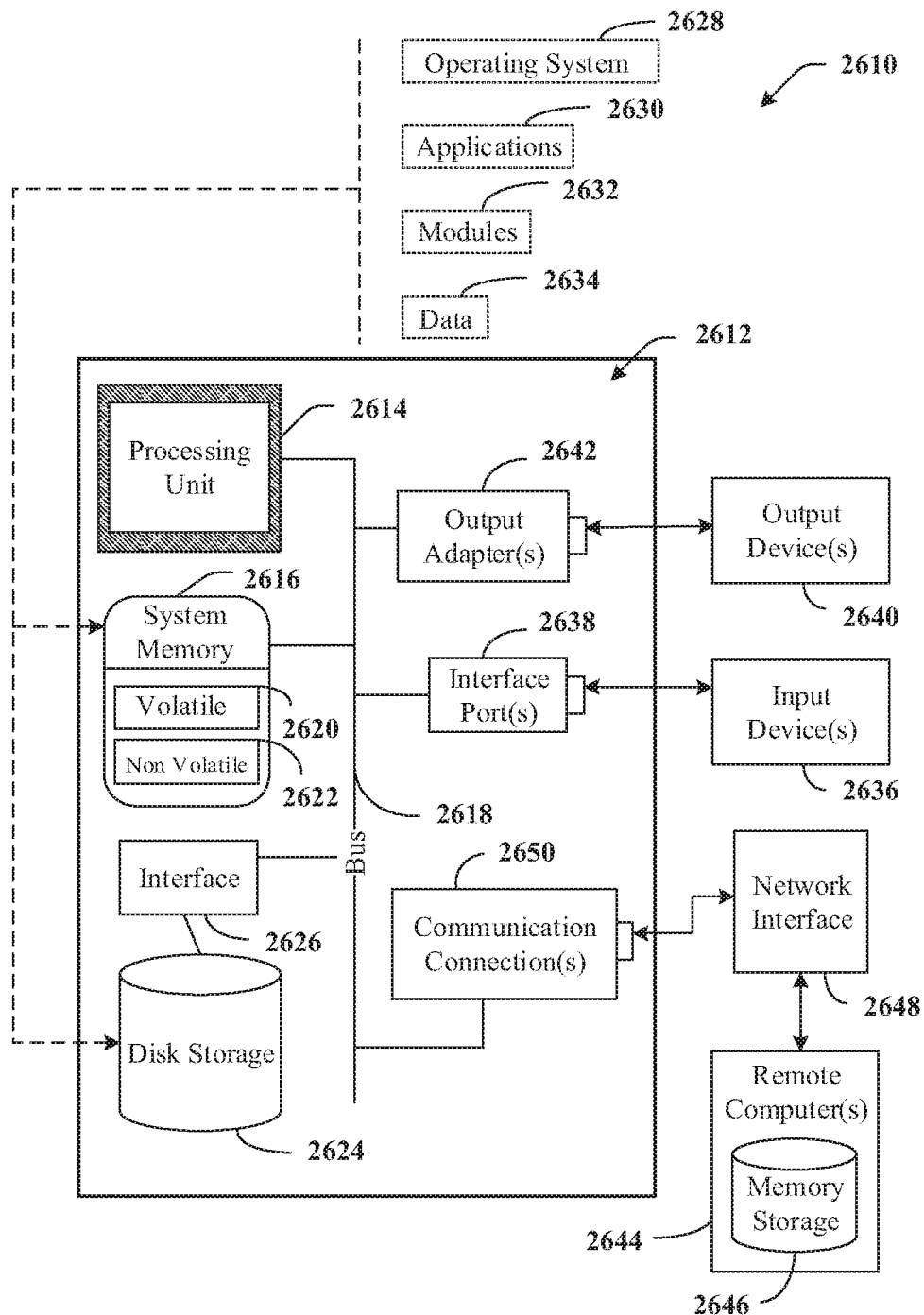
FIG. 26 is an example computing environment.

With reference to FIG. 26, an example environment 2610 for implementing various aspects of the aforementioned subject matter includes a computer 2612. The computer 2612 includes a processing unit 2614, a system memory 2616, and a system bus 2618. The system bus 2618 couples system components including, but not limited to, the system memory 2616 to the processing unit 2614. The processing unit 2614 can be any of various available processors. Dual microprocessors and other multiprocessor architectures also can be employed as the processing unit 2614.

The system bus 2618 can be any of several types of bus structure(s) including the memory bus or memory controller, a peripheral bus or external bus, and/or a local bus using any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 2616 includes volatile memory 2620 and nonvolatile memory 2622. The basic input/output system (BIOS), containing the basic routines to transfer information between elements within the computer 2612, such as during start-up, is stored in nonvolatile memory 2622. By way of illustration, and not limitation, nonvolatile memory 2622 can include read only memory (ROM), programmable ROM (PROM), electrically programmable ROM (EPROM), electrically erasable PROM (EEPROM), or flash memory. Volatile memory 2620 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 2612 also includes removable/non-removable, volatile/non-volatile computer storage media. FIG. 26 illustrates, for example a disk storage 2624. Disk storage 2624 includes, but is not limited to, devices like a magnetic disk drive, floppy disk drive, tape drive, Jaz drive, Zip drive, LS-100 drive, flash memory card, or memory stick. In addition, disk storage 2624 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 2624 to the system bus 2618, a removable or non-removable interface is typically used such as interface 2626.

It is to be appreciated that FIG. 26 describes software that acts as an intermediary between users and the basic computer resources described in suitable operating environment 2610. Such software includes an operating system 2628. Operating system 2628, which can be stored on disk storage 2624, acts to control and allocate resources of the computer 2612. System applications 2630 take advantage of the management of resources by operating system 2628 through program modules 2632 and program data 2634 stored either in system memory 2616 or on disk storage 2624. It is to be appreciated that one or more embodiments of the subject disclosure can be implemented with various operating systems or combinations of operating systems.

A user enters commands or information into the computer 2612 through input device(s) 2636. Input devices 2636 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2614 through the system bus 2618 via interface port(s) 2638. Interface port(s) 2638 include, for example, a serial port, a parallel port, a game port, and a universal serial bus (USB). Output device(s) 2640 use some of the same type of ports as input device(s) 2636. Thus, for example, a USB port may be used to provide input to computer 2612, and to output information from computer 2612 to an output device 2640. Output adapter 2642 is provided to illustrate that there are some output devices 2640 like monitors, speakers, and printers, among other output devices 2640, which require special adapters. The output adapters 2642 include, by way of illustration and not limitation, video and sound cards that provide a means of connection between the output device 2640 and the system bus 2618. It should be noted that other devices and/or systems of devices provide both input and output capabilities such as remote computer(s) 2644.

Computer 2612 can operate in a networked environment using logical connections to one or more remote computers, such as remote computer(s) 2644. The remote computer(s) 2644 can be a personal computer, a server, a router, a network PC, a workstation, a microprocessor based appliance, a peer device or other common network node and the like, and typically includes many or all of the elements described relative to computer 2612. For purposes of brevity, only a memory storage device 2646 is illustrated with remote computer(s) 2644. Remote computer(s) 2644 is logically connected to computer 2612 through a network interface 2648 and then physically connected via communication connection 2650. Network interface 2648 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 2650 refers to the hardware/software employed to connect the network interface 2648 to the bus 2618. While communication connection 2650 is shown for illustrative clarity inside computer 2612, it can also be external to computer 2612. The hardware/software necessary for connection to the network interface 2648 includes, for exemplary purposes only, internal and external technologies such as, modems including regular telephone grade modems, cable modems and DSL modems, ISDN adapters, and Ethernet cards.

Figure 27:
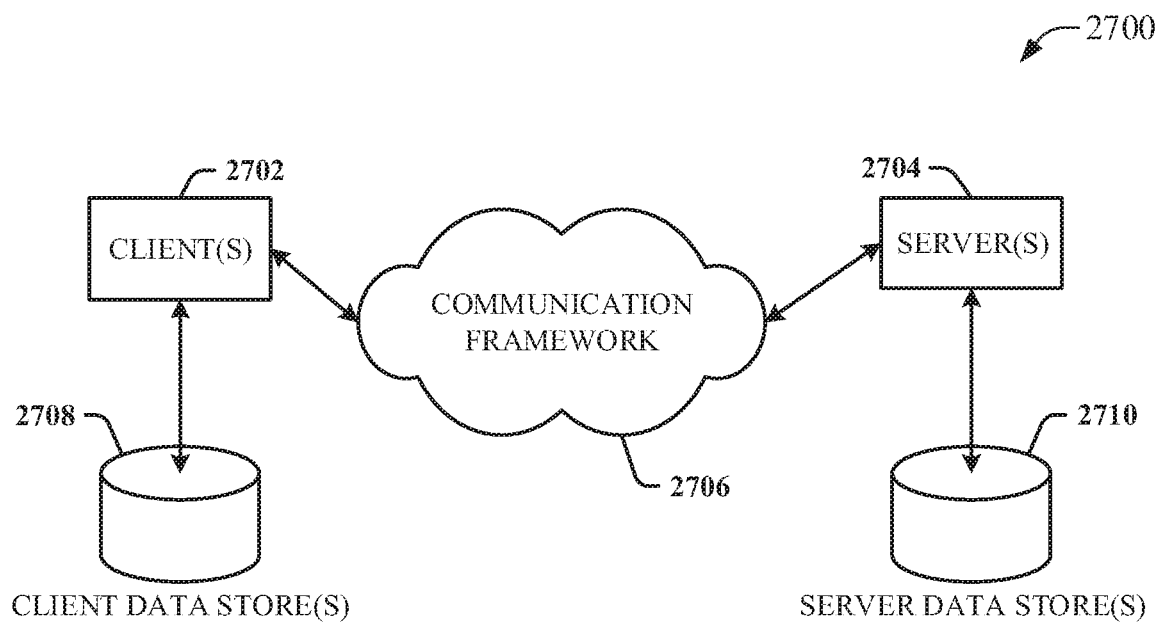
FIG. 27 is an example networking environment.

FIG. 27 is a schematic block diagram of a sample computing environment 2700 with which the disclosed subject matter can interact. The sample computing environment 2700 includes one or more client(s) 2702. The client(s) 2702 can be hardware and/or software (e.g., threads, processes, computing devices). The sample computing environment 2700 also includes one or more server(s) 2704. The server(s) 2704 can also be hardware and/or software (e.g., threads, processes, computing devices). The servers 2704 can house threads to perform transformations by employing one or more embodiments as described herein, for example. One possible communication between a client 2702 and a server 2704 can be in the form of a data packet adapted to be transmitted between two or more computer processes. The sample computing environment 2700 includes a communication framework 2706 that can be employed to facilitate communications between the client(s) 2702 and the server(s) 2704. The client(s) 2702 are operably connected to one or more client data store(s) 2708 that can be employed to store information local to the client(s) 2702. Similarly, the server(s) 2704 are operably connected to one or more server data store(s) 2710 that can be employed to store information local to the servers 2704.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:

1. A system of smart shingles located on a building and capable of automated system diagnostics, comprising:
   at least one shingle, wherein the at least one shingle comprises:
   an electronic processor;
   a computer-readable memory;
   a solar collector; and
   a location component, wherein the location component performs at least one of determining, receiving, or storing an absolute position of the at least one shingle or a relative position of the at least one shingle in relation to the system.

2. The system of claim 1, wherein the at least one shingle further comprises a thermo-electric component that converts thermal energy collected from at least one of the sun or a temperature differential within the building into electricity.

3. The system of claim 1, further comprising at least one battery, located inside or outside the at least one shingle, wherein the at least one battery stores DC electricity produced by the solar collector.

4. The system of claim 3, further comprising at least one converter, located inside or outside the at least one shingle, wherein the at least one converter converts AC electricity received from the building to DC electricity to be used for at least one of charging the at least one battery or powering another component of the at least one shingle.

5. The system of claim 1, wherein the at least one shingle further comprises at least one sensor component that is capable of determining an aspect regarding at least one of an operating condition or a functionality of the at least one shingle.

6. The system of claim 5, wherein the at least one sensor component comprises at least one of:
 a power sensor component, wherein the power sensor component is capable of determining at least one of a net electric power output or a net power consumption of the at least one shingle;
 an efficiency sensor component, wherein the efficiency sensor component is capable of determining an efficiency with which the at least one shingle generates electricity;
 a temperature sensor component, wherein the temperature sensor component is capable of detecting at least one of a temperature of a surface of the at least one shingle or an ambient temperature associated with the at least one shingle;
 a pressure sensor component, wherein the pressure sensor component is capable of determining at least one of an amount of pressure or an amount of force that is applied to a surface of the at least one shingle;
 a light sensor component, wherein the light sensor component is capable of at least one of:
  detecting at least one of a presence of light or an amount of light incident on a surface of the at least one shingle; or
  determining a distance between the at least one shingle and an object that is at least partially obstructing a light which would otherwise be incident on a surface of the at least one shingle;
 a moisture sensor component, wherein the moisture sensor component is capable of at least one of:
  detecting at least one of a presence of liquid, moisture, or humidity or an amount of liquid, moisture, or humidity on a surface of the at least one shingle; or
  detecting at least one of a presence of liquid, moisture, or humidity or an amount of liquid, moisture, or humidity within the at least one shingle; or
 a corrosion/continuity sensor component, wherein the corrosion/continuity sensor component is capable of at least one of:
  determining whether a given electrical connection within the at least one shingle is severed; or
  detecting at least one of a presence of corrosion or an amount of corrosion of a given electrical connection within the at least one shingle.

7. The system of claim 5, wherein the at least one shingle further comprises an artificial intelligence component, wherein the artificial intelligence component is capable of leveraging data collected by at least one of the at least one sensor component or the location component in order to perform at least one of conducting system diagnostics or generating recommended solutions.

8. The system of claim 7, wherein the at least one shingle further comprises an inter-shingle communication component, wherein the inter-shingle communication component is capable of allowing the at least one shingle to leverage data collected by at least one of a sensor component or a location component of another shingle in the system.

9. The system of claim 5, further comprising at least one of:
 a heating component, located inside or outside the at least one shingle, wherein the heating component generates heat by consuming electricity and can be used to help keep the at least one shingle clear of snow or ice accumulation;
 an actuator component, located inside or outside the at least one shingle, wherein the actuator component can perform at least one of:
  clearing the at least one shingle of a debris other than snow or ice accumulation; or
  adjusting an angle of incidence between the at least one shingle and a light that is at least partially incident on the at least one shingle; or
 an LED component, wherein the LED component is capable of displaying at least one light that is visible from an external view of the at least one shingle.

10. The system of claim 5, further comprising a controller, wherein the at least one shingle is communicatively coupled to said controller and wherein said controller comprises:
 an electronic processor;
 a computer-readable memory;
 a control program which can instruct the controller to perform at least one of:
  determining a neighboring shingle of the at least one shingle;
  monitoring any data gathered by the at least one sensor component of the at least one shingle; and
  conducting system diagnostics for the at least one shingle;
 a user input component, wherein the user input component allows a user to interact, locally or remotely, with the controller; and
 a notification component, wherein the notification component notifies a user of data collected by at least one of the at least one sensor component or the location component.

11. The system of claim 10, wherein the controller further comprises a power regulation component, wherein the power regulation component is capable of controlling an amount of electricity that is channeled to or from the at least one shingle.

12. The system of claim 11, wherein the controller further comprises a building monitoring component, wherein the building monitoring component is capable of determining at least one of a net power usage of the building or an internal temperature of the building.

13. The system of claim 11, wherein the controller further comprises an artificial intelligence component, wherein the artificial intelligence component is capable of leveraging data collected by at least one of the at least one sensor component or the location component in order to perform at least one of conducting system diagnostics or generating recommended solutions.

14. A method for performing automated system diagnostics for a smart shingle system located on a building, comprising:
   employing a processor, located in at least one of a shingle of the smart shingle system or a controller of the smart shingle system, to execute computer executable components stored in a memory to perform the following acts:
   auto-mapping, by the system, the system of smart shingles to determine at least one of an absolute location of the shingle or a relative location of the shingle in relation to the system.

15. The method of claim 14, further comprising:
   collecting, by the system, at least one of real-time data or historical data concerning at least one of a functionality or an operating condition of the shingle;
   analyzing, by the system, the collected data to identify a problem concerning the shingle;
   determining, by the system, appropriate or recommended solutions to the problem; and
   notifying, by the system, a user of the system of the problem and corresponding solution.

16. The method of claim 15, wherein the data comprise at least one of:
   a power generation of the shingle;
   an efficiency of the shingle;
   at least one of a temperature of a surface of the shingle or an ambient temperature associated with the shingle;
   an amount of pressure or force applied to a surface of the shingle;
   at least one of a presence, an absence, or an intensity of a light incident on a surface of the shingle;
   at least one of:
      a presence or an absence of at least one of a liquid or a moisture on a surface of the shingle;
      a presence or an absence of at least one of a liquid or a moisture within the shingle; and
   at least one of a continuity measurement or a level of corrosion regarding an electrical connection within the shingle or between the shingle and the controller.

17. The method of claim 15, further comprising automatically executing a recommended solution, wherein the recommended solution comprises at least one of:
   clearing away snow or ice that has accumulated on the shingle by activating at least one heating component that is integrated into the system;
   clearing away a debris, other than snow or ice, that has accumulated on the shingle by activating at least one actuator component that is integrated into the system; or
   otherwise diverting electricity from the building to the shingle.

18. A non-transitory computer-readable medium having stored thereon instructions that, in response to execution, cause a system of smart shingles, located on a building and comprising a processor, to perform operations, the operations comprising:
   automapping the system of smart shingles to determine at least one of an absolute position of a shingle or a relative position of the shingle in relation to the system.

19. The non-transitory computer-readable medium of claim 18, further comprising:
   collecting at least one of real-time data or historical data concerning at least one of a functionality or an operating condition of the shingle;
   analyzing the data to identify a problem concerning the shingle;
   determining a recommended solution to the problem; and
   notifying a user of the system of the problem and the recommended solution.

20. The non-transitory computer-readable medium of claim 18, wherein the operations further comprise automatically executing the recommended solution, wherein the recommended solution comprises at least one of:
   clearing away snow or ice that has accumulated on the shingle by activating at least one heating component that is integrated into the system;
   clearing away a debris, other than snow or ice, that has accumulated on the shingle by activating at least one actuator component that is integrated into the system; or
   otherwise diverting any electricity from the building to the shingle.

* * * * *